US012660287B2

(12) United States Patent (10) Patent No.: US 12,660,287 B2

Hatada (45) Date of Patent: Jun. 16, 2026

(54) SEMICONDUCTOR DEVICE

(71) Applicants:KABUSHIKI KAISHA TOSHIBA, Tokyo (JP); TOSHIBA ELECTRONIC DEVICES & STORAGE CORPORATION, Tokyo (JP)

(72) Inventor: Hiroki Hatada, Kanazawa Ishikawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 697 days.

(21) Appl. No.: 18/085,426

(22) Filed: Dec. 20, 2022

(65) Prior Publication Data

US 2024/0088250 A1 Mar. 14, 2024

(30) Foreign Application Priority Data

Sep. 8, 2022 (JP) .................................. 2022-143064

(51) Int. Cl.
| | |
|---|---|
| *H10D 64/27* | (2025.01) |
| *H10D 12/00* | (2025.01) |
| *H10D 30/66* | (2025.01) |

(52) U.S. Cl.
CPC ......... *H10D 64/519* (2025.01); *H10D 12/481* (2025.01); *H10D 30/668* (2025.01); *H10D 64/518* (2025.01)

(58) Field of Classification Search
CPC .. H10D 62/127; H10D 62/393; H10D 64/117; H10D 30/665; H10D 64/513;
(Continued)

(56) References Cited

U.S. PATENT DOCUMENTS

| | | |
|---|---|---|
| 6,887,760 B2 | 5/2005 | Curro' et al. |
| 8,816,431 B2 | 8/2014 | Bowers |

(Continued)

FOREIGN PATENT DOCUMENTS

| | | |
|---|---|---|
| JP | 4818903 B2 | 11/2011 |
| JP | 5164333 B2 | 3/2013 |

(Continued)

*Primary Examiner* — Galina G Yushina

(74) *Attorney, Agent, or Firm* — Kim & Stewart LLP

(57) ABSTRACT

According to one embodiment, a semiconductor device includes first to third electrodes, first to third semiconductor regions and a gate electrode. The first semiconductor region is located on the first electrode and electrically connected with the first electrode. The second semiconductor region is located on the first semiconductor region. The third semiconductor region is located on the second semiconductor region. The gate electrode faces the second semiconductor region via a gate insulating layer. An upper part of the gate electrode includes first and second electrode portions. The first electrode portion faces the third semiconductor region via the gate insulating layer. The second electrode portion is arranged with the first electrode portion. The second electrode is located on the second and third semiconductor regions. The third electrode includes an interconnect part located on the second electrode portion and is separated from the second electrode.

12 Claims, 27 Drawing Sheets

(58) Field of Classification Search

CPC .. H10D 64/519; H10D 12/481; H10D 30/668; H10D 12/038; H10D 30/0297; H01L 23/481

See application file for complete search history.

(56) References Cited

U.S. PATENT DOCUMENTS

| | | | |
|---|---|---|---|
| 10,263,082 B2 | 4/2019 | Utsumi et al. | |
| 10,453,930 B2 | 10/2019 | Nishiguchi | |
| 2004/0173844 A1 | 9/2004 | Williams et al. | |
| 2007/0166925 A1* | 7/2007 | Takeda ................. | H10D 30/663 257/E27.06 |
| 2016/0181408 A1* | 6/2016 | Aichinger ............ | H10D 12/481 257/77 |
| 2018/0240867 A1* | 8/2018 | Nitta .................... | H10D 62/127 |
| 2018/0308943 A1* | 10/2018 | Nishiguchi .......... | H10D 64/117 |
| 2020/0295150 A1 | 9/2020 | Nishiwaki et al. | |
| 2021/0036149 A1* | 2/2021 | Kyogoku ........... | H10D 64/2527 |

FOREIGN PATENT DOCUMENTS

| | | | |
|---|---|---|---|
| JP | 6135181 B2 | 5/2017 | |
| JP | 2020-150185 A | 9/2020 | |
| JP | 6840611 B2 | 3/2021 | |
| JP | 6848317 B2 | 3/2021 | |

* cited by examiner

SEMICONDUCTOR DEVICE

CROSS-REFERENCE TO RELATED APPLICATIONS

This application is based upon and claims the benefit of priority from Japanese Patent Application No. 2022-143064, filed on Sep. 8, 2022; the entire contents of which are incorporated herein by reference.

FIELD

Embodiments described herein relate generally to a semiconductor device.

BACKGROUND

Semiconductor devices such as metal oxide semiconductor field effect transistors (MOSFETs), insulated gate bipolar transistors (IGBTs), and the like are used in applications such as power conversion. It is desirable for the on-resistance to be low and the breakdown voltage to be high in such a semiconductor device.

DETAILED DESCRIPTION

Figure 1:
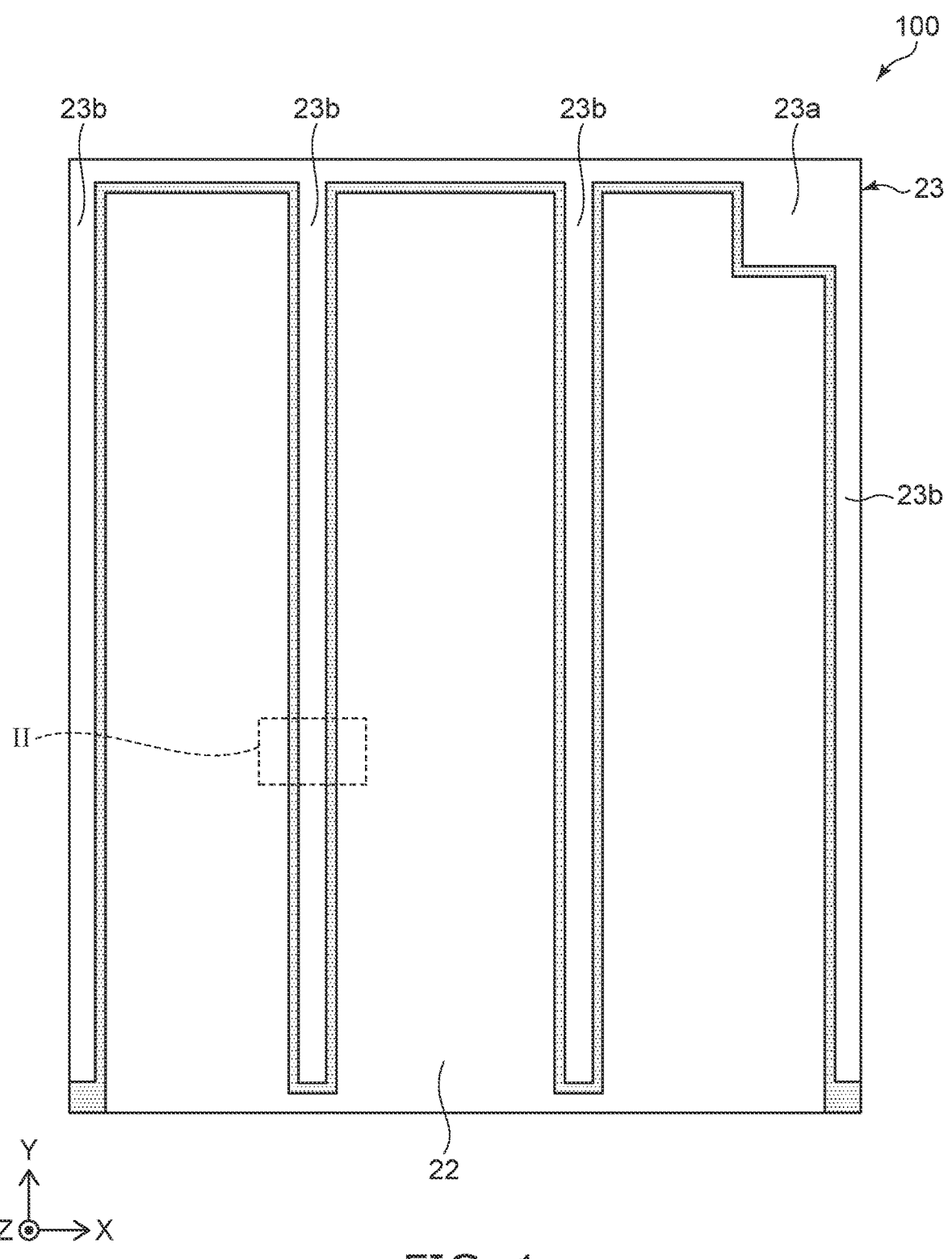
FIG. 1 is a plan view showing a semiconductor device according to a first embodiment.

According to one embodiment, a semiconductor device includes a first electrode, a first semiconductor region of a first conductivity type, a second semiconductor region of a second conductivity type, a third semiconductor region of the first conductivity type, a gate electrode, a second electrode, and a third electrode. The first semiconductor region is located on the first electrode and electrically connected with the first electrode. The second semiconductor region is located on the first semiconductor region. The third semiconductor region is located on the second semiconductor region. The gate electrode faces the second semiconductor region via a gate insulating layer in a second direction. The second direction is perpendicular to a first direction. The first direction is from the first electrode toward the first semiconductor region. An upper part of the gate electrode includes a first electrode portion and a second electrode portion. The first electrode portion faces the third semiconductor region via the gate insulating layer in the second direction. The second electrode portion is arranged with the first electrode portion in a third direction perpendicular to the first and second directions. A length in the second direction of the second electrode portion is greater than a length in the second direction of the first electrode portion and greater than a length in the second direction of a lower part of the gate electrode. The second electrode is located on the second and third semiconductor regions and electrically connected with the second and third semiconductor regions. The third electrode is separated from the second electrode. The third electrode includes an interconnect part located on the second electrode portion and electrically connected with the second electrode portion.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

In the following description and drawings, the notations of $n^+$, n, $n^-$, and $p^+$, p indicate relative levels of the impurity concentrations. In other words, a notation marked with "+" indicates that the impurity concentration is relatively greater than that of a notation not marked with either "+" or "−"; and a notation marked with "−" indicates that the impurity concentration is relatively less than that of a notation without any mark. When both a p-type impurity and an n-type impurity are included in each region, these notations indicate relative levels of the net impurity concentrations after the impurities are compensated.

First Embodiment

Figure 2:
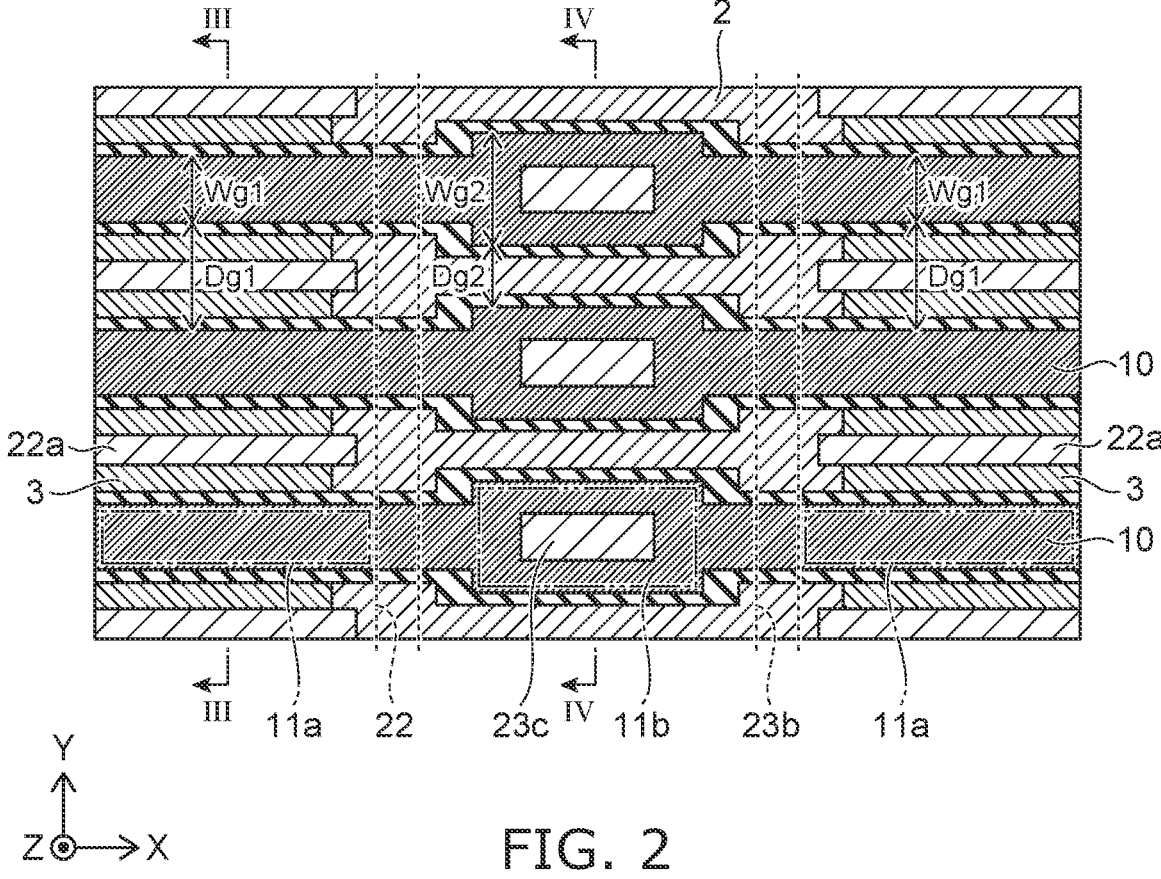
FIG. 2 is an enlarged plan view of portion II of FIG. 1.
Figure 3:
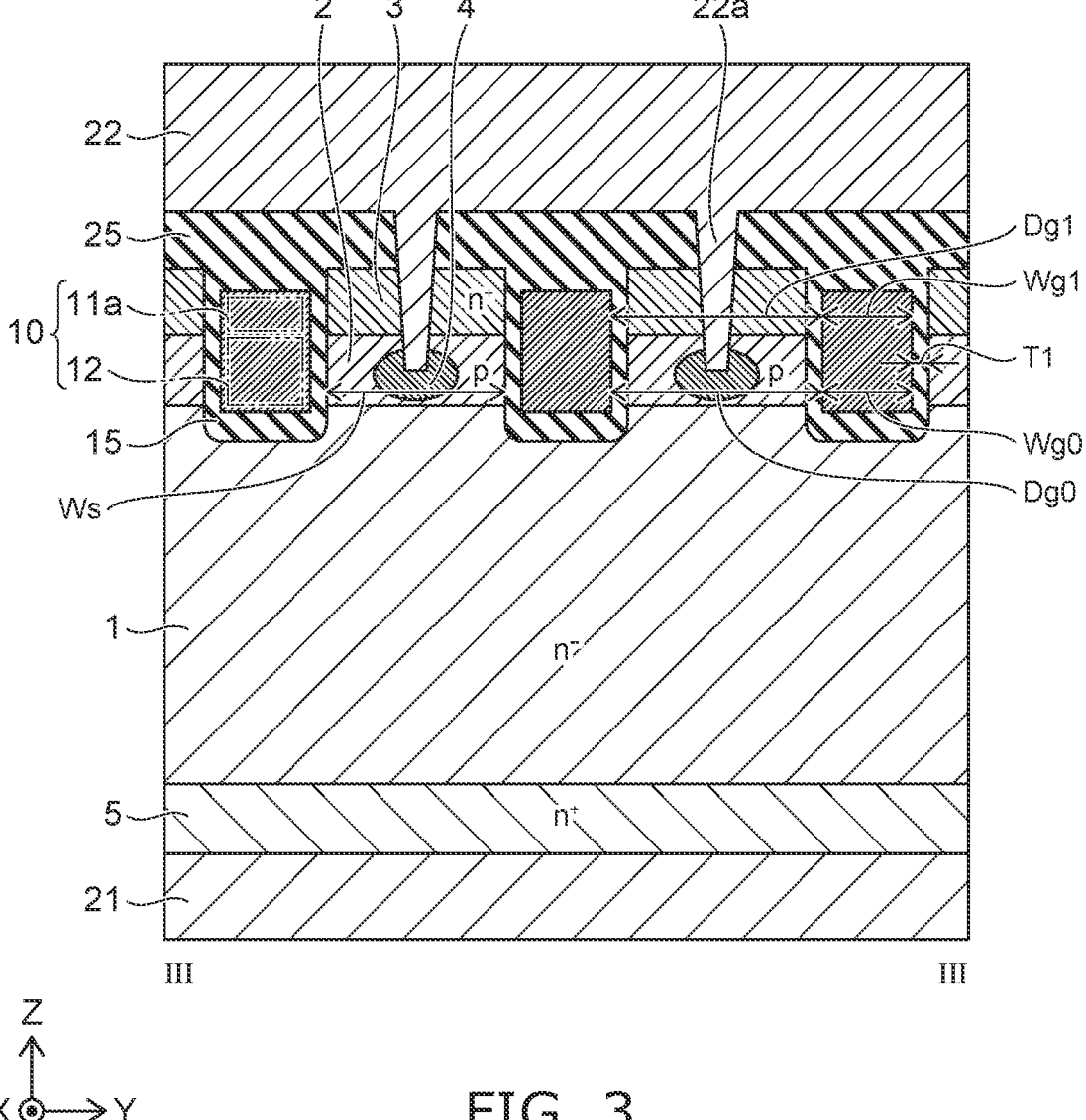
FIG. 3 is a III-III cross-sectional view of FIG. 2.
Figure 4:
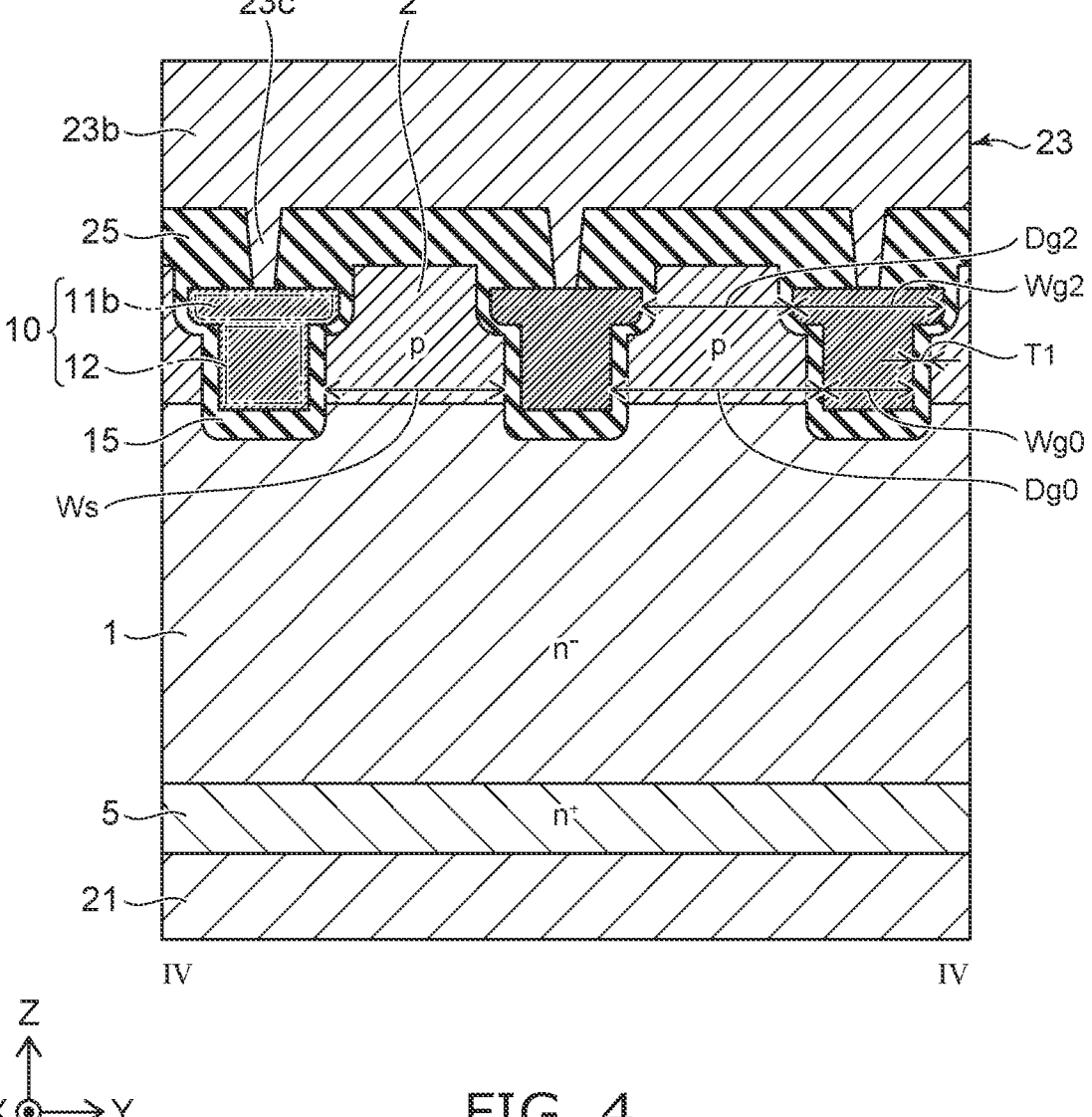
FIG. 4 is a IV-IV cross-sectional view of FIG. 2.

FIG. 1 is a plan view showing a semiconductor device according to a first embodiment. FIG. 2 is an enlarged plan view of portion II of FIG. 1. FIGS. 3 and 4 are respectively a III-III cross-sectional view and a IV-IV cross-sectional view of FIG. 2.

The semiconductor device 100 according to the first embodiment shown in FIGS. 1 to 4 is a MOSFET. The semiconductor device 100 includes an $n^-$-type (first-conductivity-type) drift region 1 (a first semiconductor region), a p-type (second-conductivity-type) base region 2 (a second semiconductor region), an $n^+$-type source region 3 (a third semiconductor region), a $p^+$-type contact region 4, an $n^+$-type drain region 5, a gate electrode 10, a gate insulating layer 15, a drain electrode 21 (a first electrode), a source electrode 22 (a second electrode), a gate pad 23 (a third electrode), and an insulating layer 25.

An XYZ orthogonal coordinate system is used in the description of the embodiments. The direction from the drain electrode 21 toward the $n^-$-type drift region 1 is taken as a Z-direction (a first direction). Two mutually-orthogonal directions perpendicular to the Z-direction are taken as an X-direction (a third direction) and a Y-direction (a second direction). In the description, the direction from the drain electrode 21 toward the $n^-$-type drift region 1 is called "up", and the opposite direction is called "down". These directions are based on the relative positional relationship between the drain electrode 21 and the $n^-$-type drift region 1 and are independent of the direction of gravity.

As shown in FIG. 1, the source electrode 22 and the gate pad 23 are located at the upper surface of the semiconductor device 100. The source electrode 22 and the gate pad 23 are separated from each other and electrically isolated.

The gate pad 23 includes a pad part 23a and an interconnect part 23b. An interconnect such as a bonding wire or the like is connected to the pad part 23a. The interconnect part 23b is connected with the pad part 23a and extends in the X-direction or the Y-direction. In the illustrated example, the interconnect part 23b and a portion of the source electrode 22 are alternately arranged in the X-direction. Multiple source electrodes 22 may be arranged in the X-direction; and the interconnect part 23b may be located between the source electrodes 22.

As shown in FIG. 2, the gate electrode 10 extends in the X-direction under the source electrode 22 and the gate pad 23. Multiple gate electrodes 10 are arranged in the Y-direction. In FIG. 2, the insulating layer 25 is not illustrated, and the source electrode 22 and the gate pad 23 are shown by broken lines.

As shown in FIG. 3, the drain electrode 21 is located at the lower surface of the semiconductor device 100. The $n^+$-type drain region 5 is located on the drain electrode 21 and electrically connected with the drain electrode 21. The $n^-$-type drift region 1 is located on the $n^+$-type drain region 5. The $n^-$-type drift region 1 is electrically connected with the drain electrode 21 via the $n^+$-type drain region 5. The n-type impurity concentration of the $n^-$-type drift region 1 is less than the n-type impurity concentration of the $n^+$-type drain region 5.

The p-type base region 2 is located on the $n^-$-type drift region 1. The $n^+$-type source region 3 and the $p^+$-type contact region 4 are selectively located on the p-type base region 2. The p-type impurity concentration of the $p^+$-type contact region 4 is greater than the p-type impurity concentration of the p-type base region 2. The gate electrode 10 faces the p-type base region 2 via the gate insulating layer 15 in the Y-direction.

As shown in FIGS. 2 to 4, the gate electrode 10 includes an upper part 11 and a lower part 12. The upper part 11 is positioned on the lower part 12. The width of a portion of the upper part 11 is greater than the width of the lower part 12. The "width" corresponds to the Y-direction length.

More specifically, the upper part 11 includes a first electrode portion 11a and a second electrode portion 11b. The first electrode portion 11a faces the $n^+$-type source region 3 via the gate insulating layer 15 in the Y-direction. The second electrode portion 11b is arranged with the first electrode portion 11a in the X-direction. The second electrode portion 11b is arranged with the p-type base region 2 with the gate insulating layer 15 interposed in the Y-direction. A width Wg2 of the second electrode portion 11b is greater than a width Wg1 of the first electrode portion 11a and greater than a width Wg0 of the lower part 12. For example, a step exists between the second electrode portion 11b and the lower part 12. As shown in FIG. 2, the first electrode portion 11a and the second electrode portion 11b are alternately arranged in the X-direction.

As shown in FIGS. 2 to 4, according to the relationship of the widths Wg0 to Wg2, a distance Dg2 is less than a distance Dg0 and less than a distance Dg1. The distance Dg0 is the distance in the Y-direction between a pair of adjacent lower parts 12 in the Y-direction. The distance Dg1 is the distance in the Y-direction between a pair of adjacent first electrode portions 11a in the Y-direction. The distance Dg2 is the distance in the Y-direction between a pair of adjacent second electrode portions 11b in the Y-direction.

As shown in FIGS. 2 and 4, the interconnect part 23b is positioned on the second electrode portion 11b. The insulating layer 25 is located between the p-type base region 2 and the interconnect part 23b and between the gate electrode 10 and the interconnect part 23b. The interconnect part 23b includes a connection part 23c. The connection part 23c extends through the insulating layer 25 in the Z-direction and contacts the second electrode portion 11b. The second electrode portion 11b is electrically connected with the interconnect part 23b by the connection part 23c. In other words, the gate electrode 10 and the gate pad 23 are electrically connected.

As shown in FIG. 3, the source electrode 22 may include a connection part 22a. The connection part 22a extends in the Z-direction and extends through the insulating layer 25. The connection part 22a is arranged with the $n^+$-type source region 3 and a portion of the p-type base region 2 in the Y-direction. The $n^+$-type source region 3 is positioned between the connection part 22a and the first electrode portion 11a in the Y-direction. The $p^+$-type contact region 4 is positioned between the p-type base region 2 and the lower end of the connection part 22a.

A voltage that is not less than a threshold is applied to the gate electrode 10 in a state in which a positive voltage with respect to the source electrode 22 is applied to the drain electrode 21. Thereby, a channel (an inversion layer) is formed in the p-type base region 2; and the semiconductor device 100 is set to the on-state. Electrons flow from the source electrode 22 toward the drain electrode 21 via the channel. When the voltage that is applied to the gate electrode 10 drops below the threshold, the channel in the p-type base region 2 disappears, and the semiconductor device 100 is switched to the off-state.

Examples of the materials of the components will now be described.

The n⁻-type drift region 1, the p-type base region 2, the n⁺-type source region 3, the p⁺-type contact region 4, and the n⁺-type drain region 5 include silicon, silicon carbide, gallium nitride, or gallium arsenide as a semiconductor material. Arsenic, phosphorus, or antimony can be used as the n-type impurity when silicon is used as the semiconductor material. Boron can be used as the p-type impurity.

The gate electrode 10 includes a conductive material such as polysilicon, etc. An n-type impurity or a p-type impurity may be added to the polysilicon. The gate electrode 10 may include at least one metal material selected from titanium, tungsten, and aluminum. The gate electrode 10 may include a nitride of the at least one metal material (e.g., titanium nitride). The gate insulating layer 15 and the insulating layer 25 include an insulating material such as silicon oxide, etc. The drain electrode 21, the source electrode 22, and the gate pad 23 include metals such as titanium, tungsten, aluminum, etc.

FIGS. 5A to 7B are cross-sectional views showing a method for manufacturing the semiconductor device according to the first embodiment.

An example of the manufacturing method will now be described with reference to FIGS. 5A to 7B. In FIGS. 5A to 7B, the drawing at the left side shows a manufacturing process of the cross-sectional structure shown in FIG. 3. The drawing at the right side shows a manufacturing process of the cross-sectional structure shown in FIG. 4.

Figure 5A:
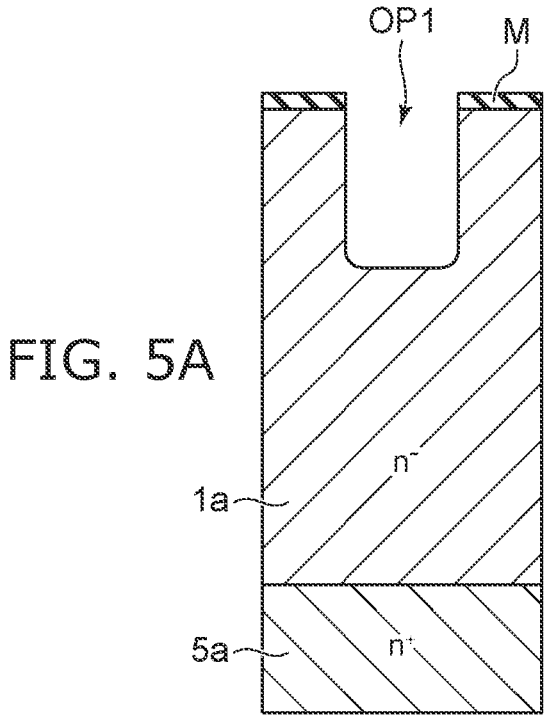
FIGS. 5A and 5B are cross-sectional views showing a method for manufacturing the semiconductor device according to the first embodiment.
Figure 5A:
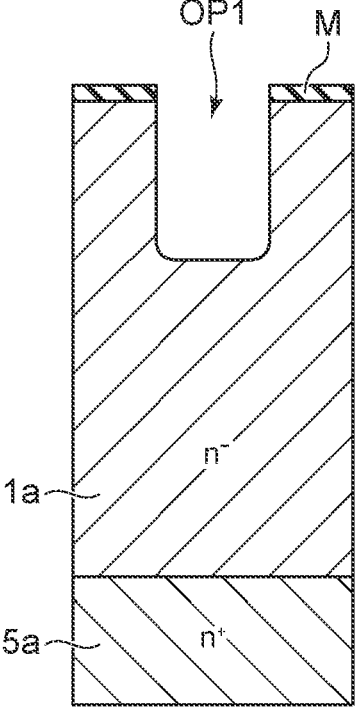

First, a semiconductor substrate that includes an n⁺-type semiconductor layer 5a and an n⁻-type semiconductor layer 1a is prepared. The n⁻-type semiconductor layer 1a is located on the n⁺-type semiconductor layer 5a. A mask M is formed on the n⁻-type semiconductor layer 1a. The mask M has an opening at a position corresponding to the gate electrode 10. As shown in FIG. 5A, the mask M is used to form an opening OP1 in the n⁻-type semiconductor layer 1a by reactive ion etching (RIE).

Figure 5B:
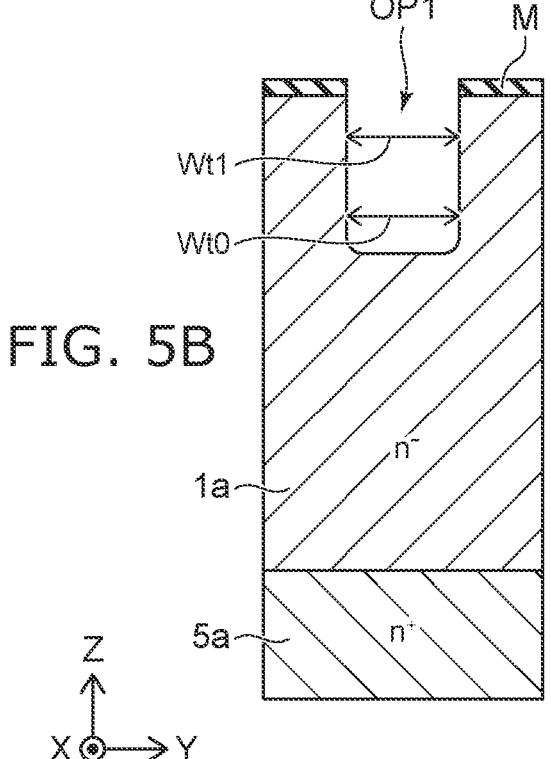
Figure 5B:
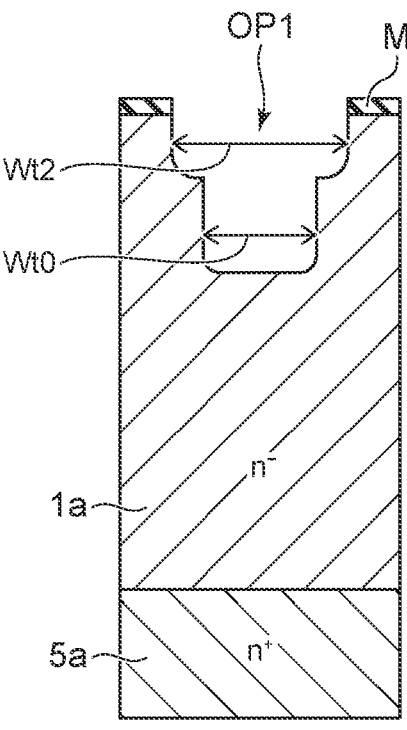

The opening of a portion of the mask M is widened by photolithography and RIE. The mask M with the widened opening is used to remove a portion of the n⁻-type semiconductor layer 1a by RIE. The etching depth of the n⁻-type semiconductor layer 1a in the second RIE is less than the etching depth of the n⁻-type semiconductor layer 1a in the first RIE. As a result, as shown in FIG. 5B, a width Wt2 of a portion of the upper part of the opening OP1 is greater than a width Wt1 of another portion of the upper part of the opening OP1 and a width Wt0 of the lower part of the opening OP1.

Figure 6A:
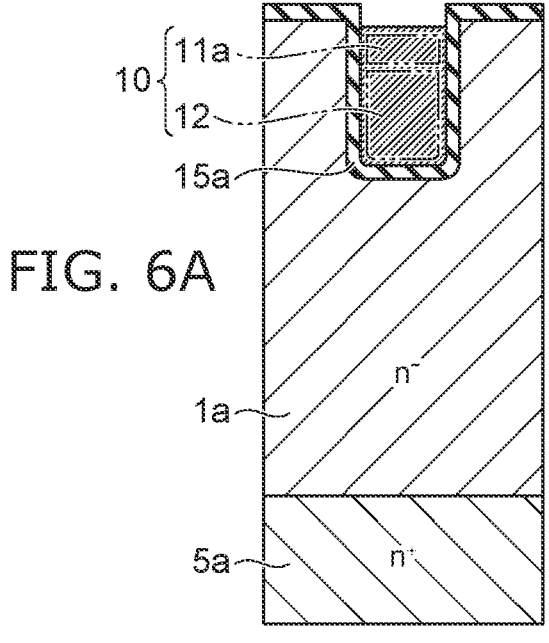
FIGS. 6A and 6B are cross-sectional views showing a method for manufacturing the semiconductor device according to the first embodiment.
Figure 6A:
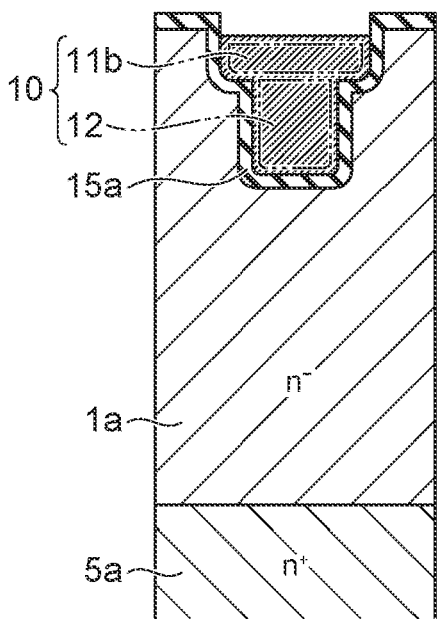

An insulating layer 15a is formed along the inner surface of the opening OP1 and the upper surface of the n⁻-type semiconductor layer 1a by thermal oxidation. A conductive layer that fills the opening OP1 is formed on the insulating layer 15a. The upper surface of the conductive layer is caused to recede by chemical mechanical polishing (CMP) and chemical dry etching (CDE). Thereby, as shown in FIG. 6A, the gate electrode 10 is formed inside the opening OP1.

The portion of the gate electrode 10 located at the portion of the upper part of the opening OP1 corresponds to the second electrode portion 11b. The portion of the gate electrode 10 located at the other portion of the upper part of the opening OP1 corresponds to the first electrode portion 11a. The portion of the gate electrode 10 located at the lower part of the opening OP1 corresponds to the lower part 12.

Figure 6B:
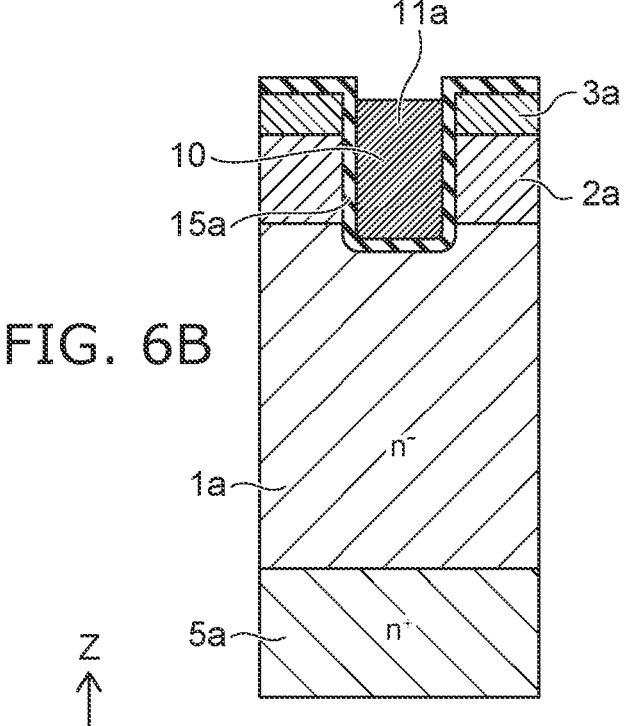
Figure 6B:
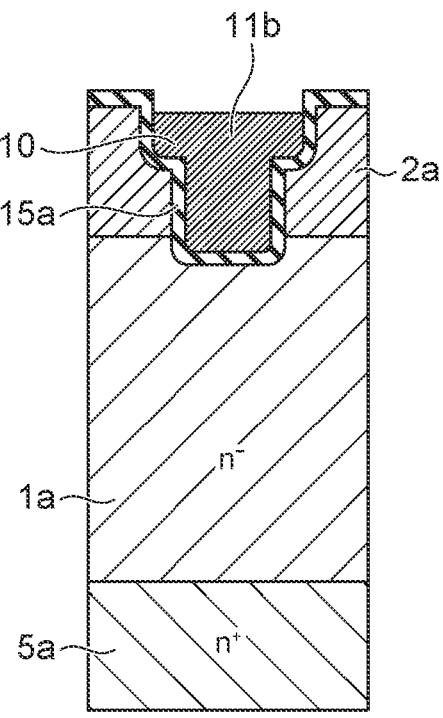

A p-type impurity concentration and an n-type impurity concentration are sequentially ion-implanted into the upper surface of the n⁻-type semiconductor layer 1a. At this time, the n-type impurity is implanted only into the periphery of the first electrode portion 11a and is not implanted into the periphery of the second electrode portion 11b. As shown in FIG. 6B, a p-type semiconductor region 2a and an n⁺-type semiconductor region 3a are formed by activating the impurities by heat treatment.

Figures 7A, 7B:
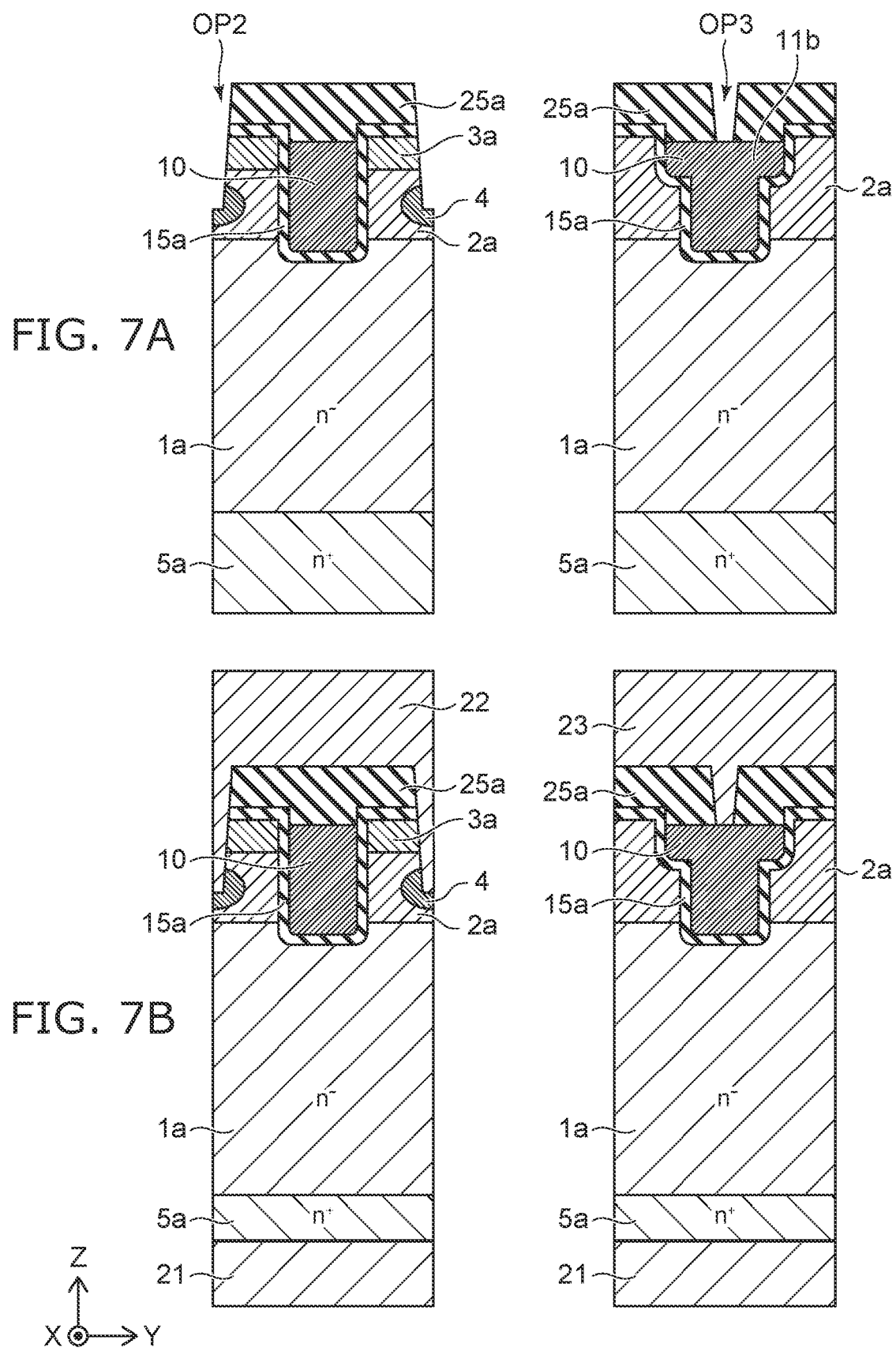
FIGS. 7A and 7B are cross-sectional views showing a method for manufacturing the semiconductor device according to the first embodiment.

An insulating layer 25a is formed on the gate electrode 10 by chemical vapor deposition (CVD). An opening OP2 is formed by removing a portion of the insulating layer 25a, a portion of the n⁺-type semiconductor region 3a, and a portion of the p-type semiconductor region 2a by RIE. A p-type impurity is ion-implanted into the exposed p-type semiconductor region 2a via the opening OP2. The p⁺-type contact region 4 is formed by activating the impurity by heat treatment. As shown in FIG. 7A, an opening OP3 is formed by removing another portion of the insulating layer 25a by RIE. The second electrode portion 11b of the gate electrode 10 is exposed via the opening OP3.

A metal layer is formed on the insulating layer 25a by sputtering. The source electrode 22 and the gate pad 23 are formed by patterning the metal layer. The lower surface of the n⁺-type semiconductor layer 5a is polished until the n⁺-type semiconductor layer 5a has a prescribed thickness. As shown in FIG. 7B, the drain electrode 21 is formed at the lower surface of the n⁺-type semiconductor layer 5a by sputtering. Thus, the semiconductor device 100 according to the first embodiment is manufactured.

The n⁻-type semiconductor layer 1a shown in FIG. 7B corresponds to the n⁻-type drift region 1 shown in FIGS. 3 and 4. The p-type semiconductor region 2a corresponds to the p-type base region 2. The n⁺-type semiconductor region 3a corresponds to the n⁺-type source region 3. The n⁺-type semiconductor layer 5a corresponds to the n⁺-type drain region 5. A portion of the insulating layer 15a corresponds to the gate insulating layer 15. The insulating layer 25a and another portion of the insulating layer 15a correspond to the insulating layer 25.

Figure 8:
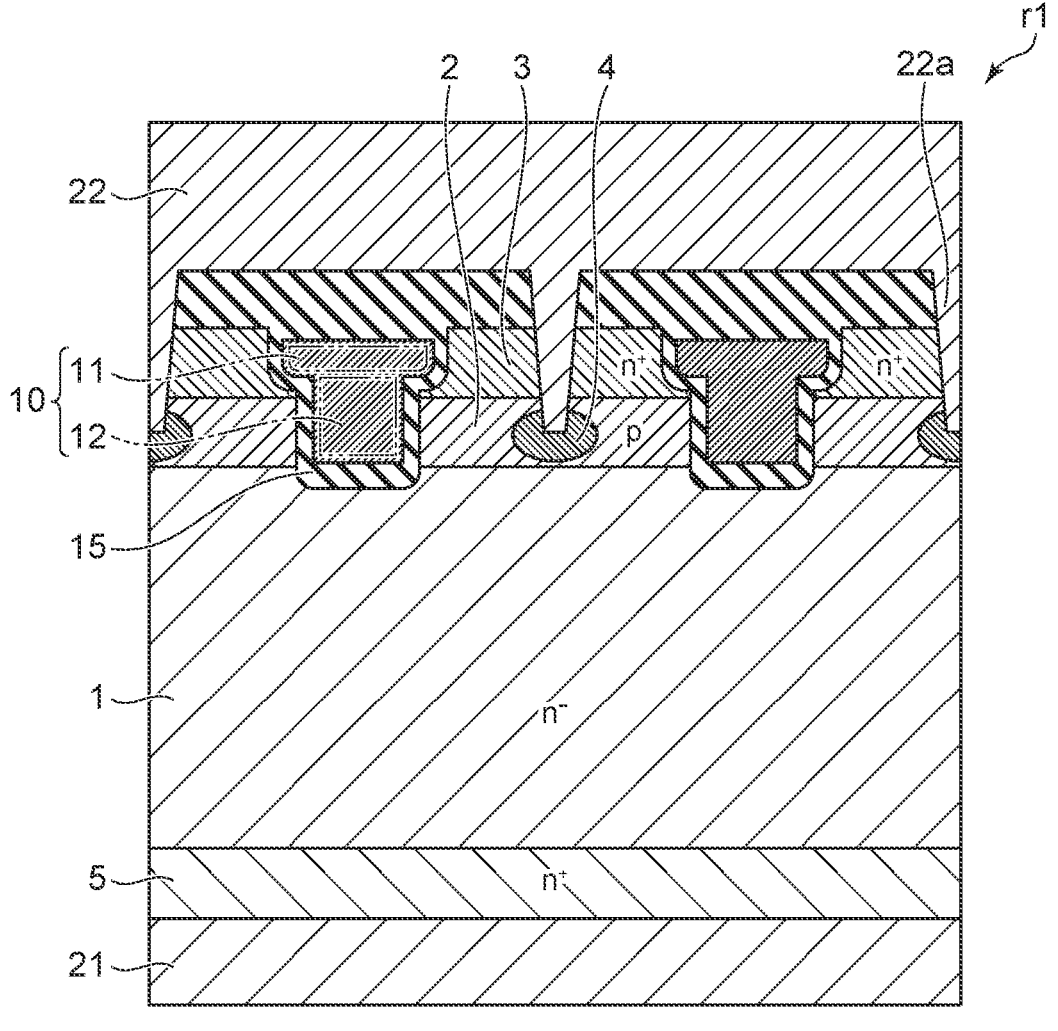
FIG. 8 is a cross-sectional view showing a semiconductor device according to a first reference example.
Figure 9A:
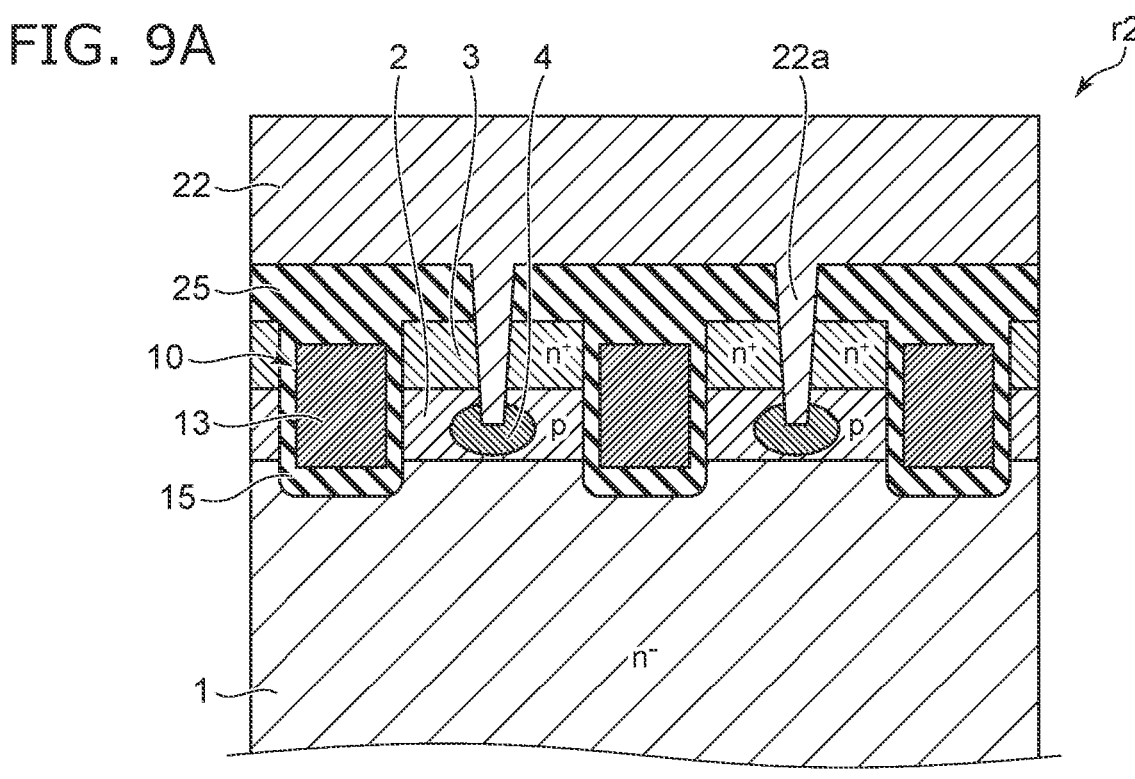
FIGS. 9A and 9B are cross-sectional views showing a semiconductor device according to a second reference example.
Figure 9B:
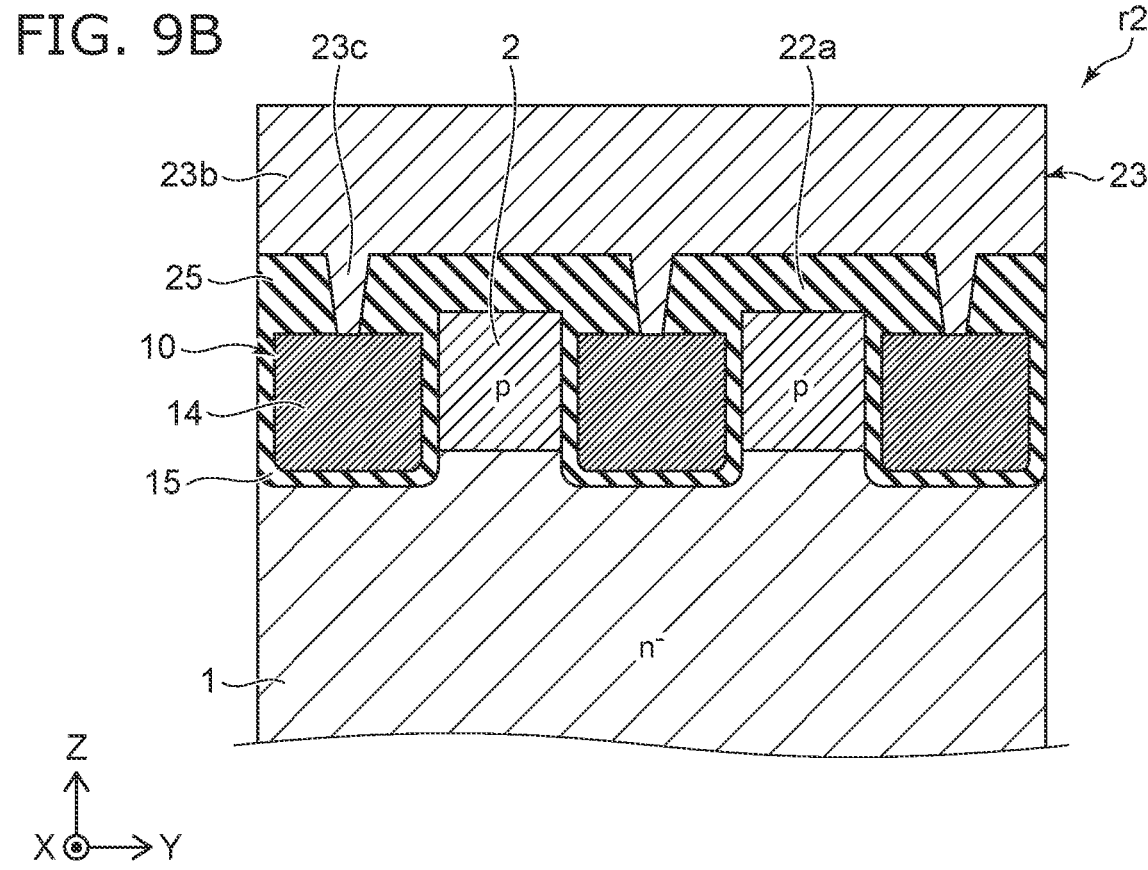

FIG. 8 is a cross-sectional view showing a semiconductor device according to a first reference example. FIGS. 9A and 9B are cross-sectional views showing a semiconductor device according to a second reference example.

In the gate electrode 10 of the semiconductor device r1 according to the first reference example shown in FIG. 8, the width of the entire upper part 11 is greater than the width of the lower part 12. In the semiconductor device r2 according to the second reference example shown in FIGS. 9A and 9B, the gate electrode 10 includes a narrow part 13 and a wide part 14. The width of the narrow part 13 is less than the width of the wide part 14. The width of the narrow part 13 is constant from the upper end to the lower end. The width of the wide part 14 is constant from the upper end to the lower end.

Advantages of the embodiment will now be described.

When electrically connecting the gate electrode 10 with the interconnect part 23b, it is necessary to form the connection part 23c to match the position of the gate electrode 10. If the position of the connection part 23c is misaligned with the position of the gate electrode 10, a connection defect occurs between the gate electrode 10 and the gate pad 23. Also, when electrically connecting the semiconductor regions such as the p-type base region 2, the n⁺-type source region 3, the p⁺-type contact region 4, etc., with the source electrode 22, it is necessary to form the connection part 22a between the gate electrodes 10. If the positions of the connection part 22*a* are misaligned with the positions of the semiconductor regions, connection defects occur between the source electrode 22 and the semiconductor regions.

To suppress the occurrence of such connection defects and increase the reliability of the semiconductor device, it is favorable to be able to easily connect the connection parts with their connection objects. For example, the connection part 23*c* can be easily connected with the gate electrode 10 by widening the gate electrode 10 at the portion connected with the connection part 23*c*. The connection part 22*a* can be easily connected with the semiconductor regions by widening the widths of the semiconductor regions connected with the connection part 22*a* by widening the spacing between the gate electrodes 10.

In the semiconductor device r1 shown in FIG. 8, the gate electrode 10 can be easily connected with the gate pad 23 because the upper part 11 is wide. On the other hand, the spacing between the gate electrodes 10 is narrow because the upper part 11 is uniformly wide. To connect the connection part 22*a* with the semiconductor regions, it is necessary to increase the gate electrode 10 pitch. The pitch corresponds to the distance between the Y-direction centers of adjacent gate electrodes 10. However, as the pitch of the gate electrode 10 increases, the channel region surface area per unit area (the channel density) decreases, and the on-resistance of the semiconductor device r1 increases.

In the semiconductor device r2 as shown in FIG. 9B, the connection between the gate electrode 10 and the interconnect part 23*b* is easy because the wide part 14 is located under the interconnect part 23*b*. Also, the narrow part 13 that is narrower than the wide part 14 is provided in regions other than the region under the interconnect part 23*b*. Therefore, compared to the semiconductor device r1, the semiconductor regions that are connected with the connection part 22*a* can be wider, and the gate electrode 10 pitch can be reduced. However, because the width of the entire wide part 14 from the upper end to the lower end is uniformly wide, the surface area of the p-n junction between the n$^-$-type drift region 1 and the p-type base region 2 is small compared to that of the semiconductor device r1. As a result, the breakdown voltage of the semiconductor device r2 is less than that of the semiconductor device r1.

In other words, according to the first or second reference example, the reliability of the semiconductor device can be increased, but an increase of the on-resistance or a reduction of the breakdown voltage occurs. For this problem, in the semiconductor device 100 according to the first embodiment, the upper part 11 of the gate electrode 10 includes the first electrode portion 11*a* and the second electrode portion 11*b*. The width Wg2 of the second electrode portion 11*b* located under the pad part 23*a* is greater than the width Wg1 of the first electrode portion 11*a*. Therefore, the connection between the gate electrode 10 and the gate pad 23 is easy. Also, the width Wg1 of the first electrode portion 11*a* is less than the width Wg2 of the second electrode portion 11*b*. Therefore, even when the gate electrode 10 pitch is reduced, the source electrode 22 can be easily connected with the semiconductor regions such as the p-type base region 2, the n$^+$-type source region 3, the p$^+$-type contact region 4, etc.

The width Wg2 of the second electrode portion 11*b* is greater than the width Wg0 of the lower part 12. In other words, the width Wg0 of the lower part 12 is less than the width of the second electrode portion 11*b*. By setting the width of the lower part 12 arranged with the p-n junction between the n$^-$-type drift region 1 and the p-type base region 2 to be narrow, compared to the semiconductor device r2, the surface area of the p-n junction can be increased, and the breakdown voltage of the semiconductor device 100 can be increased.

According to the first embodiment, the on-resistance of the semiconductor device 100 can be reduced or the breakdown voltage of the semiconductor device 100 can be increased while suppressing the degradation of the reliability of the semiconductor device 100.

It is favorable for the difference between the width Wg2 and the width Wg1 to be greater than the difference between the width Wg2 and the width Wg0 to increase the surface area of the p-n junction, and so that the second electrode portion 11*b* and the connection part 23*c* can be more easily connected. Specifically, it is favorable for the width Wg2 to be not less than 1.1 times the width Wg0 or the width Wg1. If, however, such width differences are too large, the potential at the semiconductor region between the second electrode portions 11*b* easily rises when the semiconductor device 100 is in the off-state. Breakdown of the gate insulating layer 15 easily occurs between the second electrode portion 11*b* and the semiconductor region. It is therefore favorable for the difference between the width Wg2 and the width Wg1 and the difference between the width Wg2 and the width Wg0 each to be not more than 0.9 times a width Ws of the p-type base region 2 positioned between the lower parts 12.

A portion of the lower part 12 is positioned under the first electrode portion 11*a*. Another portion of the lower part 12 is positioned under the second electrode portion 11*b*. The width Wg0 of the other portion of the lower part 12 may be different from, e.g., greater than, the width Wg0 of the portion of the lower part 12. More favorably, the width Wg0 of the other portion of the lower part 12 is substantially equal to the width Wg0 of the portion of the lower part 12. For example, the sum of a thickness T1 of the gate insulating layer 15 and the width Wg0 of the lower part 12 positioned under the second electrode portion 11*b* is greater than 0.90 times and less than 1.1 times the sum of the thickness T1 and the width Wg0 of the lower part 12 positioned under the first electrode portion 11*a*. In other words, it is favorable for the difference between the width Ws of the p-type base region 2 arranged in the Y-direction with the other portion of the lower part 12 and the width Ws of the p-type base region 2 arranged in the Y-direction with the portion of the lower part 12 to be not more than 0.1 times the sum of the thickness T1 and the width Wg0 of either portion of the lower part 12. The thickness T1 corresponds to the thickness of the gate insulating layer 15 in the X-direction between the gate electrode 10 and the p-type base region 2. According to this configuration, the surface area of the p-n junction can be greater, and the breakdown voltage of the semiconductor device 100 can be further improved.

Second Embodiment

Figure 10:
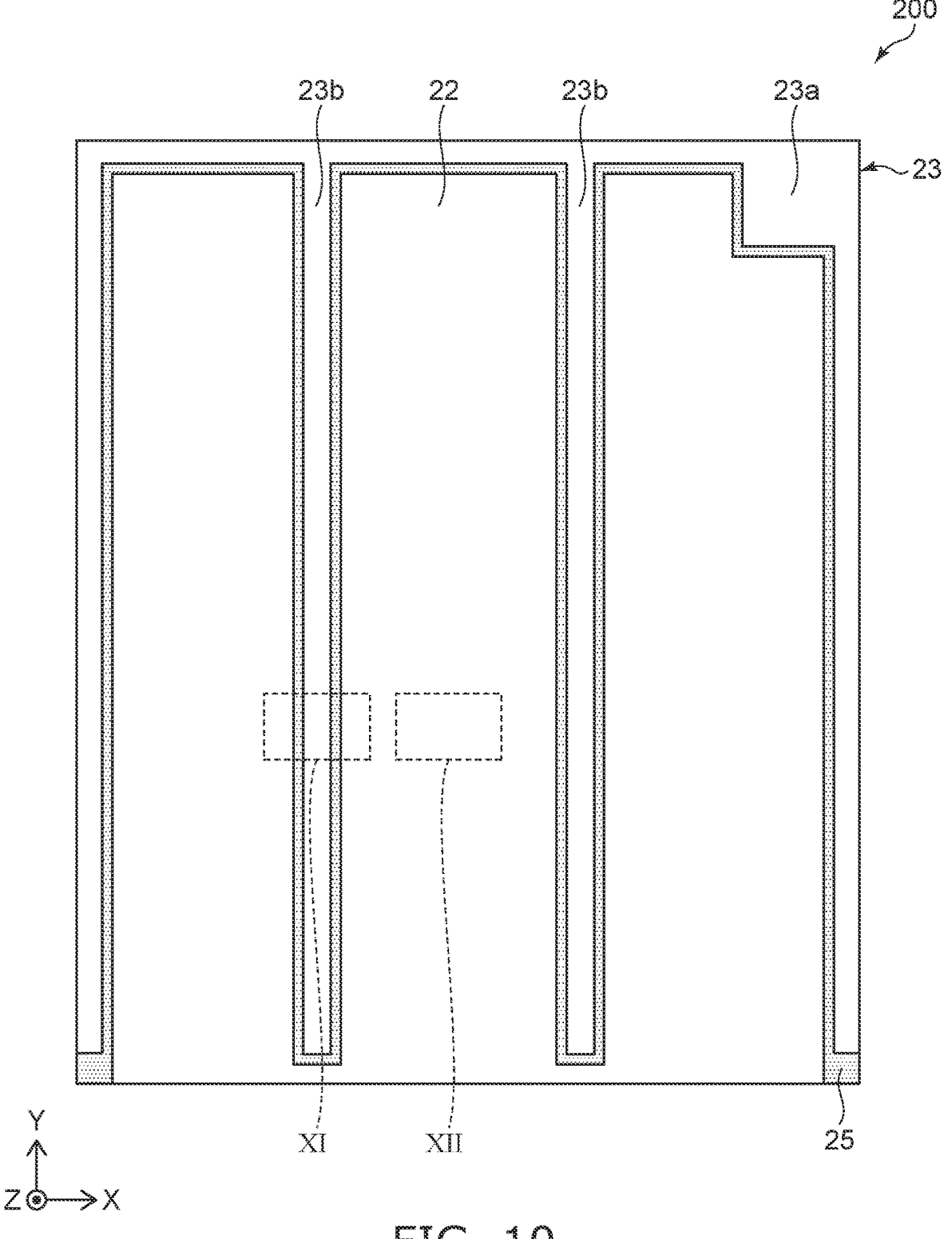
FIG. 10 is a plan view showing a semiconductor device according to a second embodiment.
Figures 11, 12:
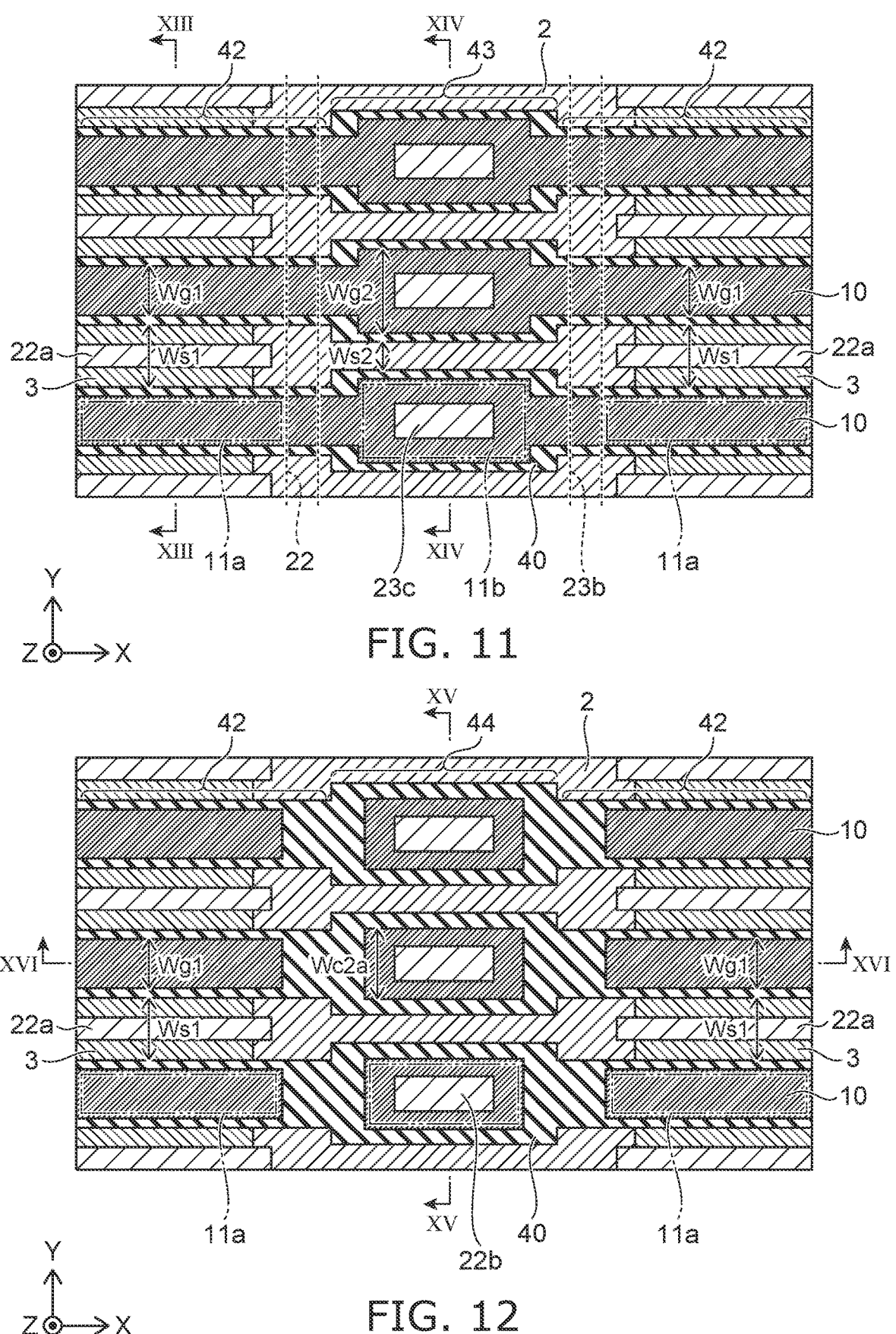
FIG. 11 is a plan views showing portion XI of FIG. 10.
FIG. 12 is a plan views showing portion XII of FIG. 10.

FIG. 10 is a plan view showing a semiconductor device according to a second embodiment. FIGS. 11 and 12 are respectively plan views showing portion XI and portion XII of FIG. 10. FIGS. 13 to 16 are respectively a XIII-XIII cross-sectional view of FIG. 11, a XII-XIV cross-sectional view of FIG. 11, a XI-XV cross-sectional view of FIG. 12, and a XVI-XVI cross-sectional view of FIG. 12.

Compared to the semiconductor device 100, the semiconductor device 200 according to the second embodiment shown in FIGS. 10 to 16 further includes a conductive part 30 and an insulating part 40.

Figure 13:
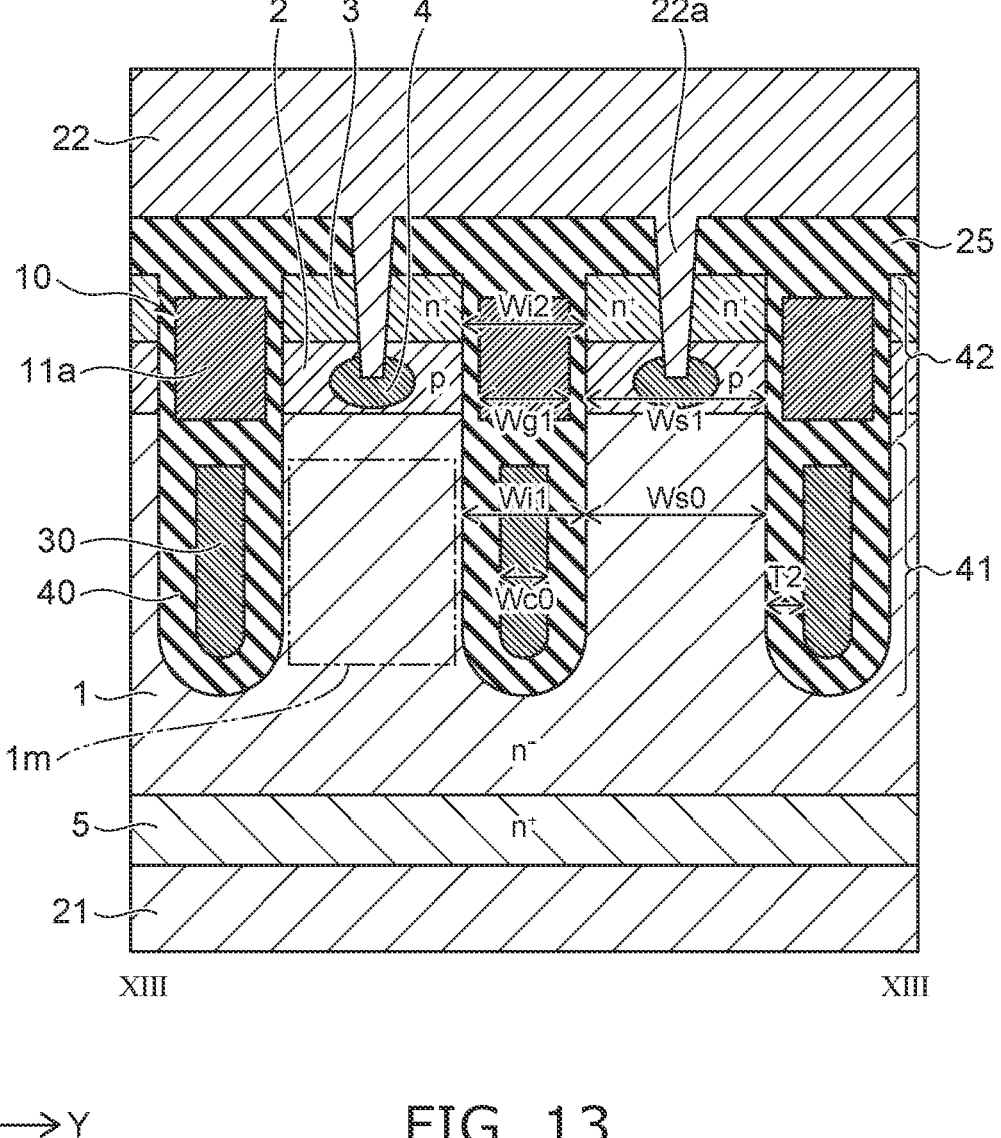
FIG. 13 is a XIII-XIII cross-sectional view of FIG. 11.
Figure 14:
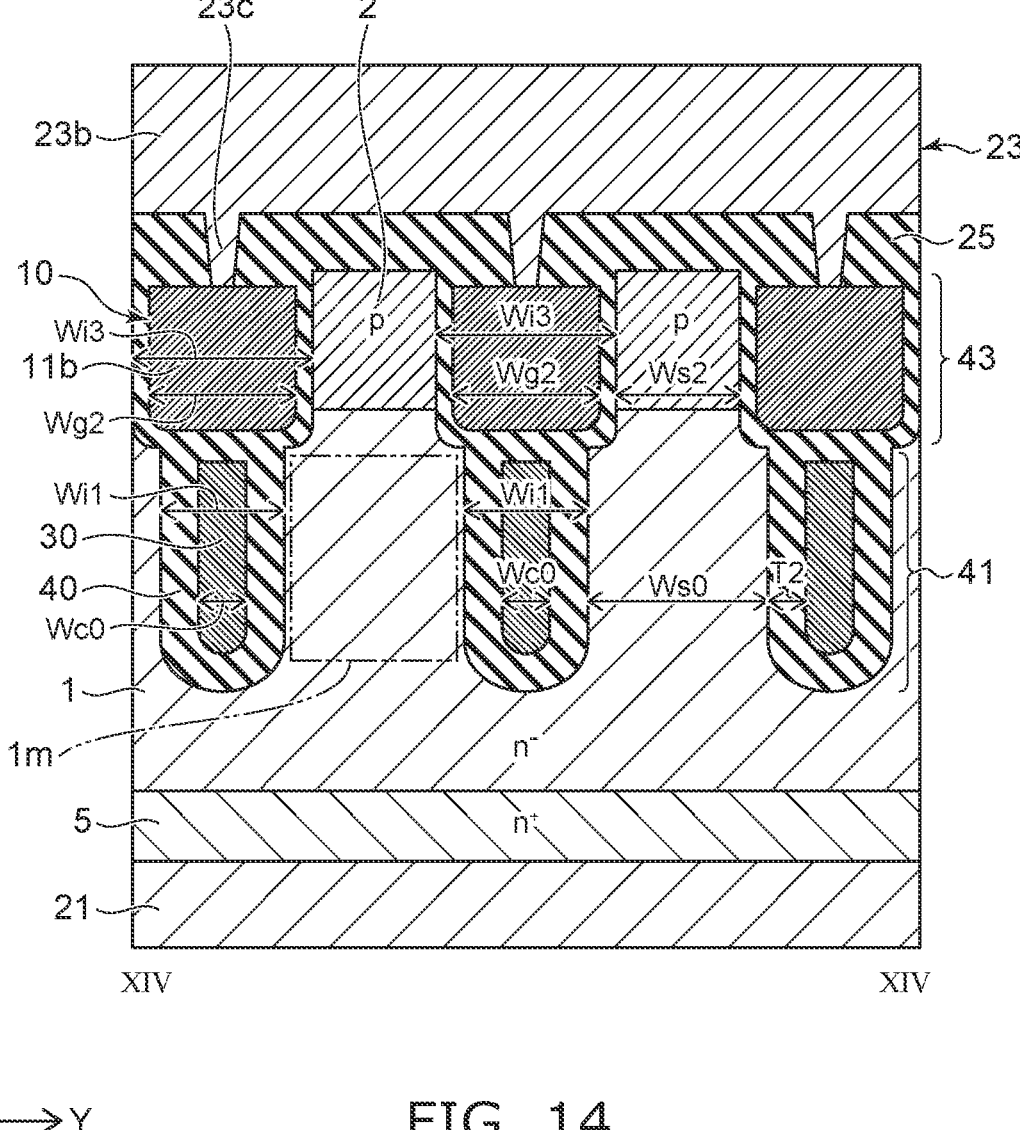
FIG. 14 is a XIV-XIV cross-sectional view of FIG. 11.

As shown in FIGS. 13 and 14, the insulating part 40 is arranged in the Y-direction with the n⁺-type source region 3, the p-type base region 2, and a portion of the n⁻-type drift region 1. The insulating part 40 includes a first insulating portion 41, a second insulating portion 42, and a third insulating portion 43.

The first insulating portion 41 is arranged with the portion of the n⁻-type drift region 1 in the Y-direction. An intermediate region 1*m* of the n⁻-type drift region 1 is positioned between the first insulating portions 41 in the Y-direction. The second insulating portion 42 and the third insulating portion 43 are located on the first insulating portion 41. The second insulating portion 42 is arranged with the p-type base region 2 and the n⁺-type source region 3 in the Y-direction. The third insulating portion 43 is arranged with the p-type base region 2 in the Y-direction. As shown in FIG. 11, the third insulating portion 43 is arranged with the second insulating portion 42 in the X-direction. The second insulating portion 42 and the third insulating portion 43 are alternately arranged in the X-direction.

Figure 15:
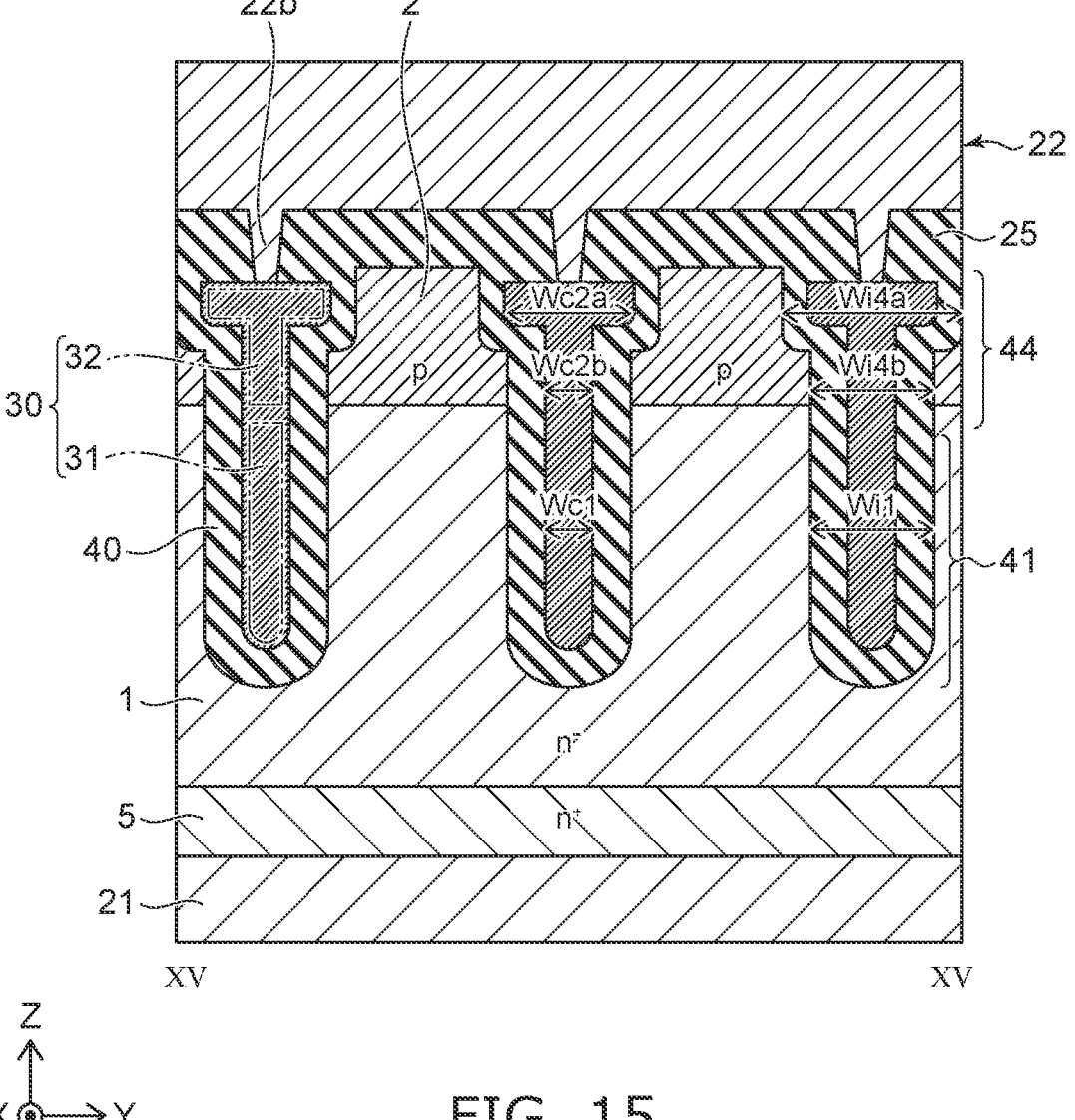
FIG. 15 is a XV-XV cross-sectional view of FIG. 12.
Figure 16:
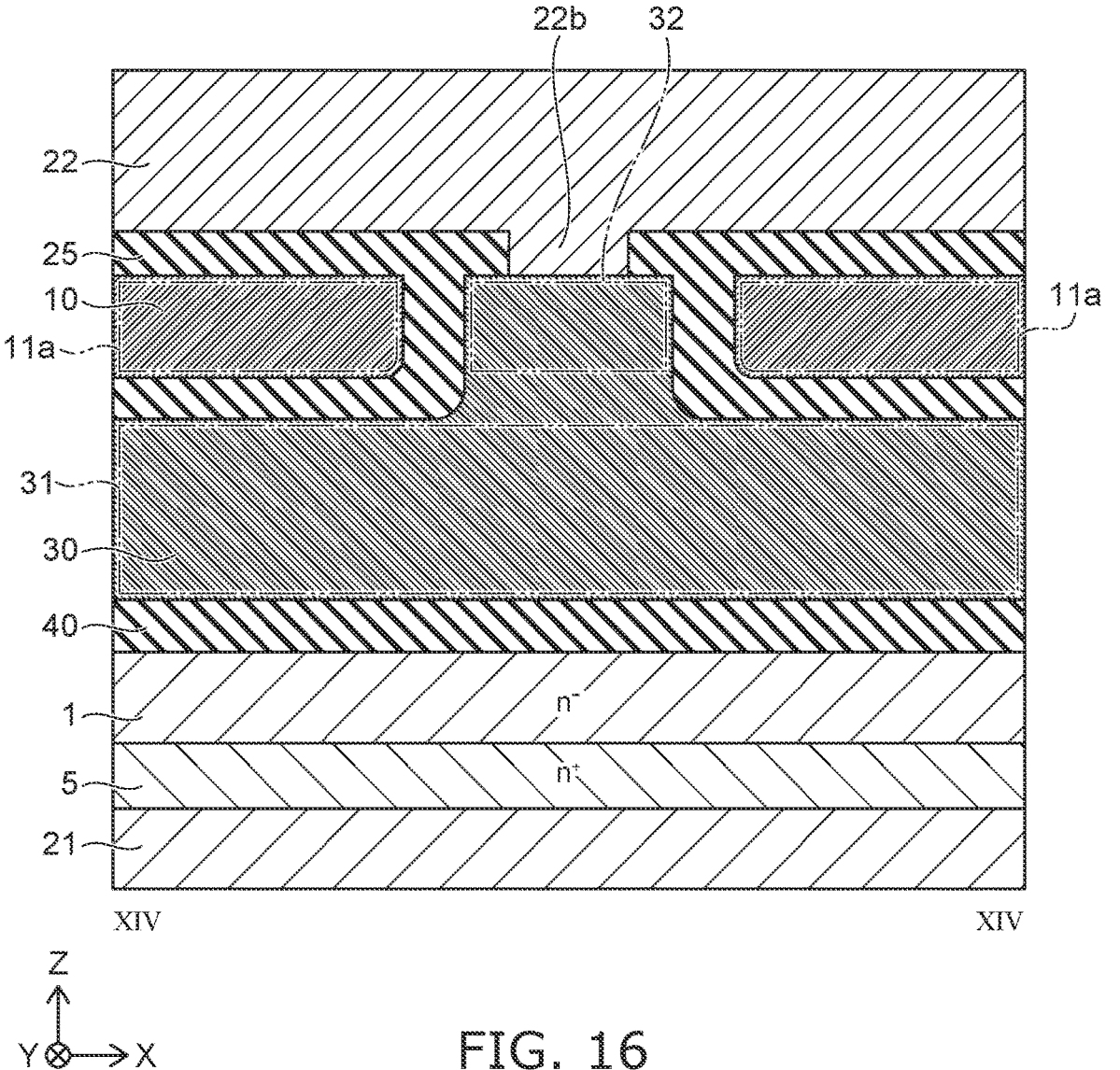
FIG. 16 is a XVI-XVI cross-sectional view of FIG. 12.

As shown in FIGS. 13 and 14, the conductive part 30 is located in the first insulating portion 41. The gate electrode 10 is located in the second insulating portion 42 and in the third insulating portion 43. The gate electrode 10 is separated from the conductive part 30 and electrically isolated from the conductive part 30. As shown in FIGS. 15 and 16, a portion of the conductive part 30 is drawn upward and is electrically connected with the source electrode 22 by a connection part 22*b*. Or, the gate electrode 10 may contact the conductive part 30. In such a case, the conductive part 30 is electrically isolated from the source electrode 22. Or, the conductive part 30 may be electrically isolated from both the gate electrode 10 and the source electrode 22. In such a case, the potential of the conductive part 30 is controlled separately from the potential of the gate electrode 10 and the potential of the source electrode 22.

As shown in FIGS. 11 to 14, the gate electrode 10 includes the first electrode portion 11*a* and the second electrode portion 11*b*. In the semiconductor device 200, the first electrode portion 11*a* and the second electrode portion 11*b* are provided not only in the upper part of the gate electrode 10 but also in the lower part of the gate electrode 10. Similarly to the semiconductor device 100, the first electrode portion 11*a* faces the p-type base region 2 and the n⁺-type source region 3 via the second insulating portion 42 in the Y-direction. The second insulating portion 42 functions as a gate insulating layer. The second electrode portion 11*b* is arranged with the first electrode portion 11*a* in the X-direction. The second electrode portion 11*b* faces the p-type base region 2 via the third insulating portion 43 in the Y-direction. The width Wg2 of the second electrode portion 11*b* is greater than the width Wg1 of the first electrode portion 11*a*, a width Wc0 of the conductive part 30, and a width Wi1 of the first insulating portion 41.

As shown in FIGS. 11 to 14, a width Ws2 is less than a width Ws0 and less than a width Ws1 according to the relationship of the widths of the first electrode portion 11*a*, the second electrode portion 11*b*, the conductive part 30, and the first insulating portion 41. The width Ws0 is the width of the n⁻-type drift region 1 positioned between a pair of adjacent conductive parts 30 in the Y-direction. The width Ws1 is the width of the p-type base region 2 positioned between a pair of adjacent first electrode portions 11*a* in the Y-direction. The width Ws2 is the width of the p-type base region 2 positioned between a pair of adjacent second electrode portions 11*b* in the Y-direction.

The conductive part 30 includes a conductive material such as polysilicon, etc. An n-type impurity or a p-type impurity may be added to the polysilicon. The conductive part 30 may include at least one metal material selected from titanium, tungsten, and aluminum. The conductive part 30 may include a nitride of the at least one metal material. The insulating part 40 includes an insulating material such as silicon oxide, etc.

Similarly to the semiconductor device 100, the semiconductor device 200 can operate as a MOSFET. When the semiconductor device 200 is switched to the off-state, a depletion layer spreads toward the n⁻-type drift region 1 from the interface between the n⁻-type drift region 1 and the insulating part 40 according to the increase of the potential difference between the n⁻-type drift region 1 and the conductive part 30. The breakdown voltage of the semiconductor device 200 can be increased by the spreading of the depletion layer. Or, the on-resistance of the semiconductor device 200 can be reduced by increasing the n-type impurity concentration in the intermediate region 1*m* while maintaining the breakdown voltage of the semiconductor device 200.

Figure 17A:
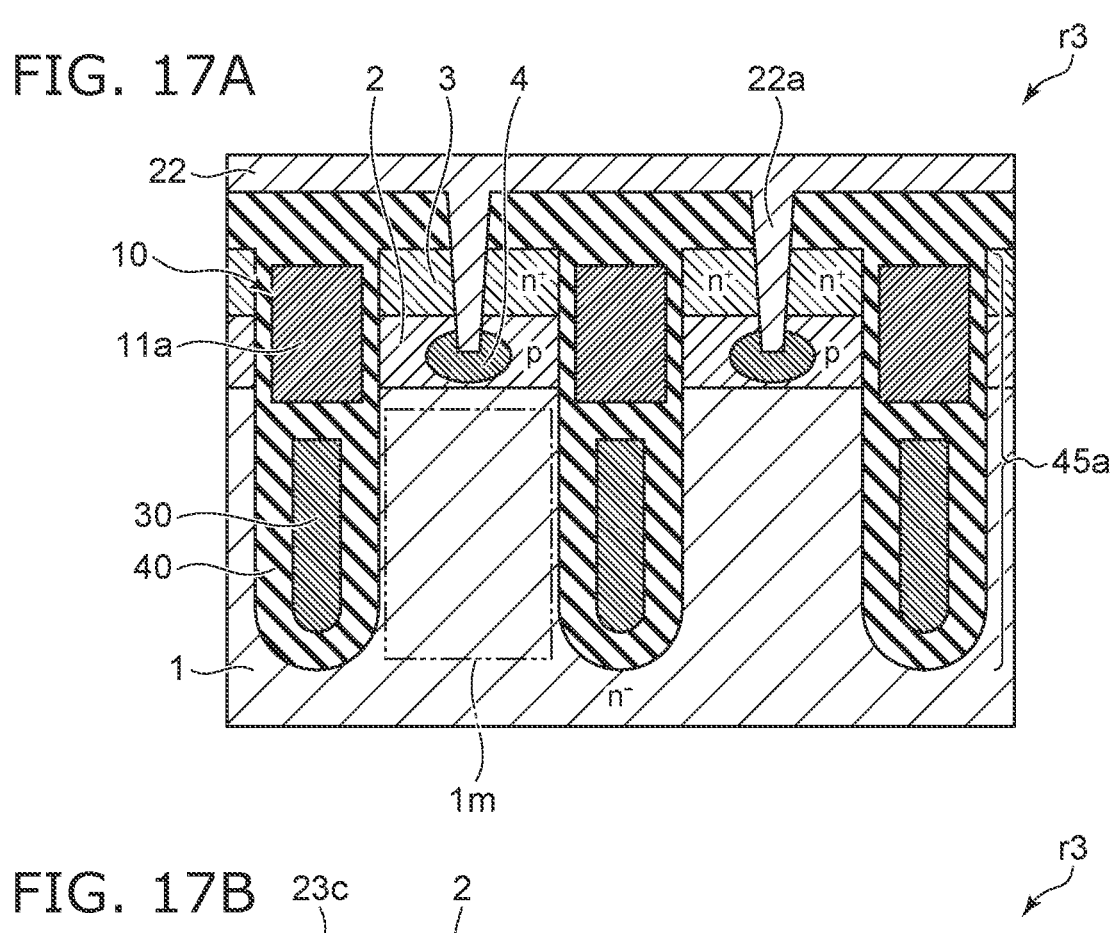
FIGS. 17A and 17B are cross-sectional views showing a semiconductor device according to a third reference example.
Figure 17B:
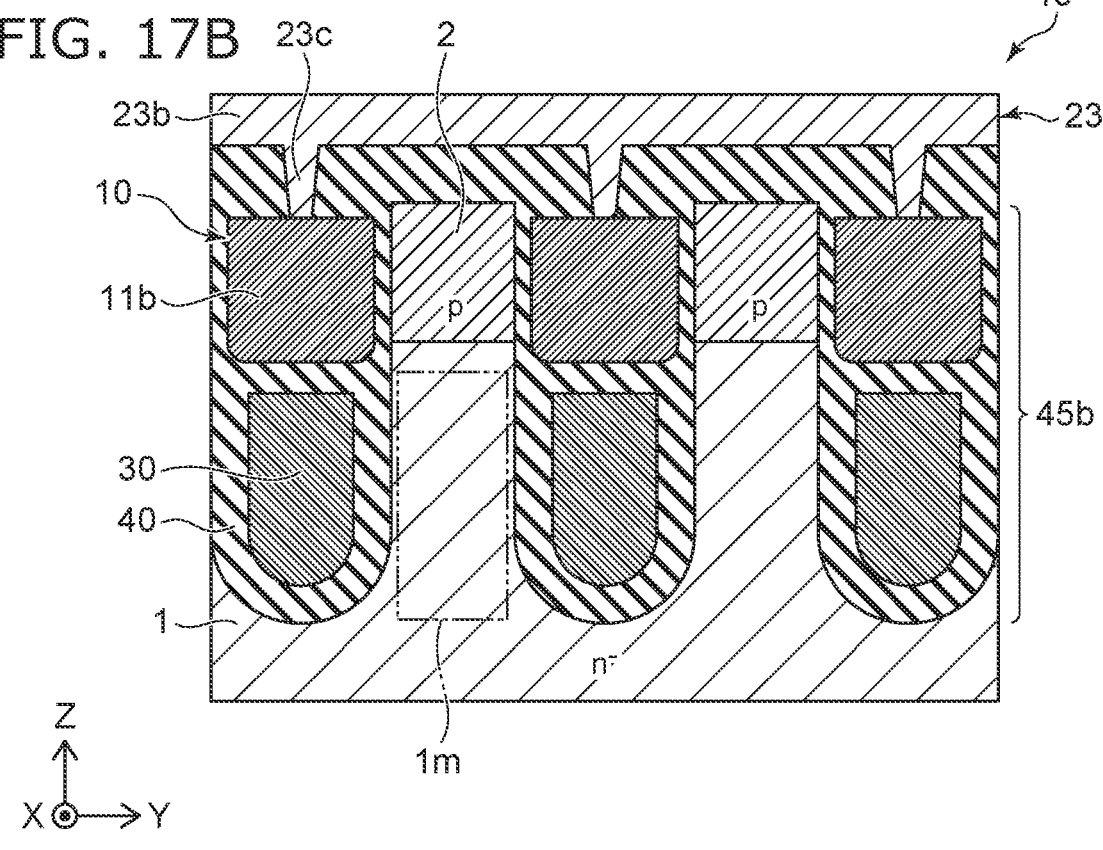

FIGS. 17A and 17B are cross-sectional views showing a semiconductor device according to a third reference example.

In the semiconductor device r3 according to the third reference example shown in FIGS. 17A and 17B, the insulating part 40 includes a narrow part 45*a* and a wide part 45*b*. The upper part of the narrow part 45*a* is arranged with the p-type base region 2 and the n⁺-type source region 3 in the Y-direction. The wide part 45*b* is arranged with the narrow part 45*a* in the X-direction. The gate electrode 10 and the conductive part 30 are located in the narrow part 45*a* and the wide part 45*b*. The width of the wide part 45*b* is greater than the width of the narrow part 45*a*.

Advantages of the second embodiment will now be described.

In the semiconductor device r3, the wide part 45*b* is located under the connection part 23*c*. Therefore, the connection part 23*c* can be easily connected with the gate electrode 10 located in the wide part 45*b*. By providing the narrow part 45*a*, the widths of the semiconductor regions connected with the connection part 22*a* can be increased, and the connection part 22*a* can be easily connected with the semiconductor regions. On the other hand, the width of the portion of the wide part 45*b* at which the gate electrode 10 is located and the width of the portion of the wide part 45*b* at which the conductive part 30 is located are substantially the same. Therefore, the width of the intermediate region 1*m* positioned between the wide parts 45*b* is less than the width of the intermediate region 1*m* positioned between the narrow parts 45*a*. When the intermediate region 1*m* is narrow, the breakdown voltage of the semiconductor device r3 is reduced because the region in which the depletion layer spreads is reduced.

For this problem, in the semiconductor device 200 according to the second embodiment, the insulating part 40 includes the first insulating portion 41, the second insulating portion 42, and the third insulating portion 43. The third insulating portion 43 is positioned under the interconnect part 23*b*; and a width Wi3 of the third insulating portion 43 is greater than a width Wi2 of the second insulating portion 42. Therefore, the interconnect part 23*b* can be easily connected with the gate electrode 10 located in the third insulating portion 43. Also, the width Wi2 of the second insulating portion 42 is less than the width Wi3 of the third insulating portion 43. Therefore, the spacing between the second insulating portions 42 is wide, and the connection part 22a can be easily connected with the semiconductor regions. The width Wi1 of the first insulating portion 41 is less than the width Wi3 of the third insulating portion 43. Therefore, compared to the semiconductor device r3, the width of the intermediate region 1m can be increased, and the breakdown voltage of the semiconductor device 200 can be increased.

According to the second embodiment, the breakdown voltage of the semiconductor device 200 can be increased while suppressing the degradation of the reliability of the semiconductor device 200.

A portion of the conductive part 30 is positioned under the first electrode portion 11a. Another portion of the conductive part 30 is positioned under the second electrode portion 11b. The width Wc0 of the other portion of the conductive part 30 may be different from, e.g., greater than, the width Wc0 of the portion of the conductive part 30. More favorably, the width Wc0 of the other portion of the conductive part 30 is substantially equal to the width Wc0 of the portion of the conductive part 30. For example, the sum of the width Wc0 of the other portion of the conductive part 30 and a thickness T2 of the insulating part 40 is greater than 0.90 times and less than 1.1 times the sum of the thickness T2 and the width Wc0 of the portion of the conductive part 30. In other words, it is favorable for the difference between the width Ws0 of the n$^-$-type drift region 1 arranged in the Y-direction with the other portion of the conductive part 30 and the width Ws0 of the n$^-$-type drift region 1 arranged in the Y-direction with the portion of the conductive part 30 to be not more than 0.1 times the sum of the thickness T2 and the width Wc0 of either portion of the conductive part 30. The thickness T2 corresponds to the thickness of the insulating part 40 in the X-direction between the conductive part 30 and the n$^-$-type drift region 1. The sum of the width Wc0 and the thickness T2 is the width Wi1 of the first insulating portion 41. According to this configuration, the volume of the intermediate region 1m can be larger, and the breakdown voltage of the semiconductor device 200 can be further improved.

As shown in FIGS. 12 and 15, the insulating part 40 may further include a fourth insulating portion 44. The fourth insulating portion 44 is arranged in the X-direction with the second insulating portion 42. The second insulating portion 42 is positioned between the third insulating portion 43 and the fourth insulating portion 44 in the X-direction. A width Wi4a of the upper part of the fourth insulating portion 44 is greater than the width Wi1 of the first insulating portion 41, the width Wi2 of the second insulating portion 42, and a width Wi4b of the lower part of the fourth insulating portion 44. The width Wi4a of the upper part of the fourth insulating portion 44 may be equal to or different from the width Wi3 of the third insulating portion 43.

A portion of the conductive part 30 is located in the fourth insulating portion 44. The conductive part 30 includes a first conductive portion 31 and a second conductive portion 32. The first conductive portion 31 faces the n$^-$-type drift region 1 via the first insulating portion 41 in the X-direction. The second conductive portion 32 is located on the first conductive portion 31. The second conductive portion 32 is arranged with the gate electrode 10 with the fourth insulating portion 44 interposed in the X-direction. A width Wc2a of the upper part of the second conductive portion 32 is greater than a width Wc2b of the lower part of the second conductive portion 32 and greater than a width Wc1 of the first conductive portion 31.

The connection part 22b of the source electrode 22 extends in the Z-direction and extends through the insulating layer 25. The connection part 22b contacts the upper surface of the second conductive portion 32. When the insulating part 40 includes the fourth insulating portion 44, the source electrode 22 can be easily connected with the second conductive portion 32. The reliability of the semiconductor device 200 can be further improved thereby.

First Modification

Figure 18:
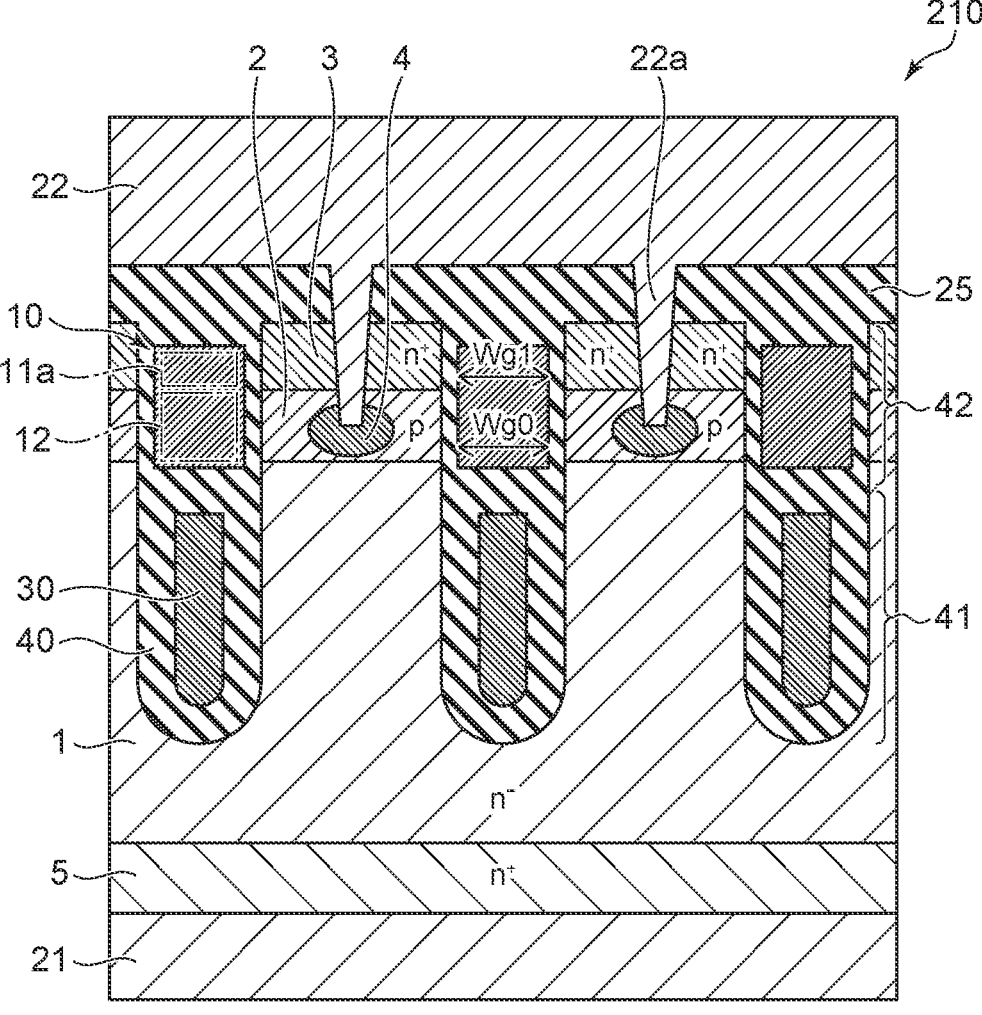
FIG. 18 is a cross-sectional view showing a semiconductor device according to a first modification of the second embodiment.
Figure 18:
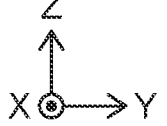
Figure 19:
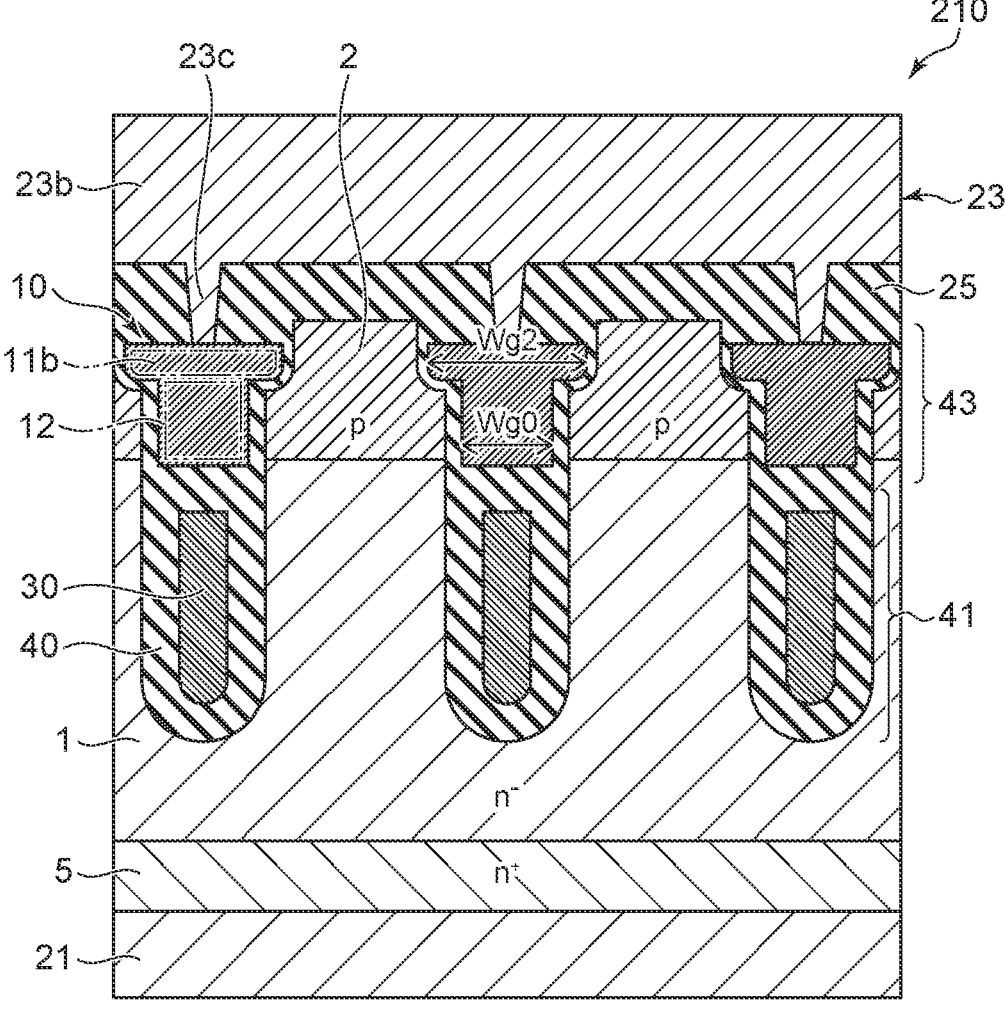
FIG. 19 is a cross-sectional view showing the semiconductor device according to the first modification of the second embodiment.
Figure 19:
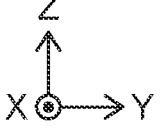

FIGS. 18 and 19 are cross-sectional views showing a semiconductor device according to a first modification of the second embodiment. FIGS. 18 and 19 correspond respectively to a XIII-XIII cross-sectional view and a XII-XIV cross-sectional view of FIG. 11.

In the semiconductor device 210 according to the first modification shown in FIGS. 18 and 19, similarly to the semiconductor device 100, the gate electrode 10 includes the upper part 11 and the lower part 12. The lower part 12 is located in the first insulating portion 41. The upper part 11 includes the first electrode portion 11a and the second electrode portion 11b. The width Wg2 of the second electrode portion 11b is greater than the width Wg1 of the first electrode portion 11a and greater than the width Wg0 of the lower part 12.

By the upper part 11 of the gate electrode 10 including the first and second electrode portions 11a and 11b, compared to the semiconductor device 200, the surface area of the p-n junction between the n$^-$-type drift region 1 and the p-type base region 2 can be increased. According to the first modification, the breakdown voltage of the semiconductor device 210 can be increased.

Second Modification

Figure 20:
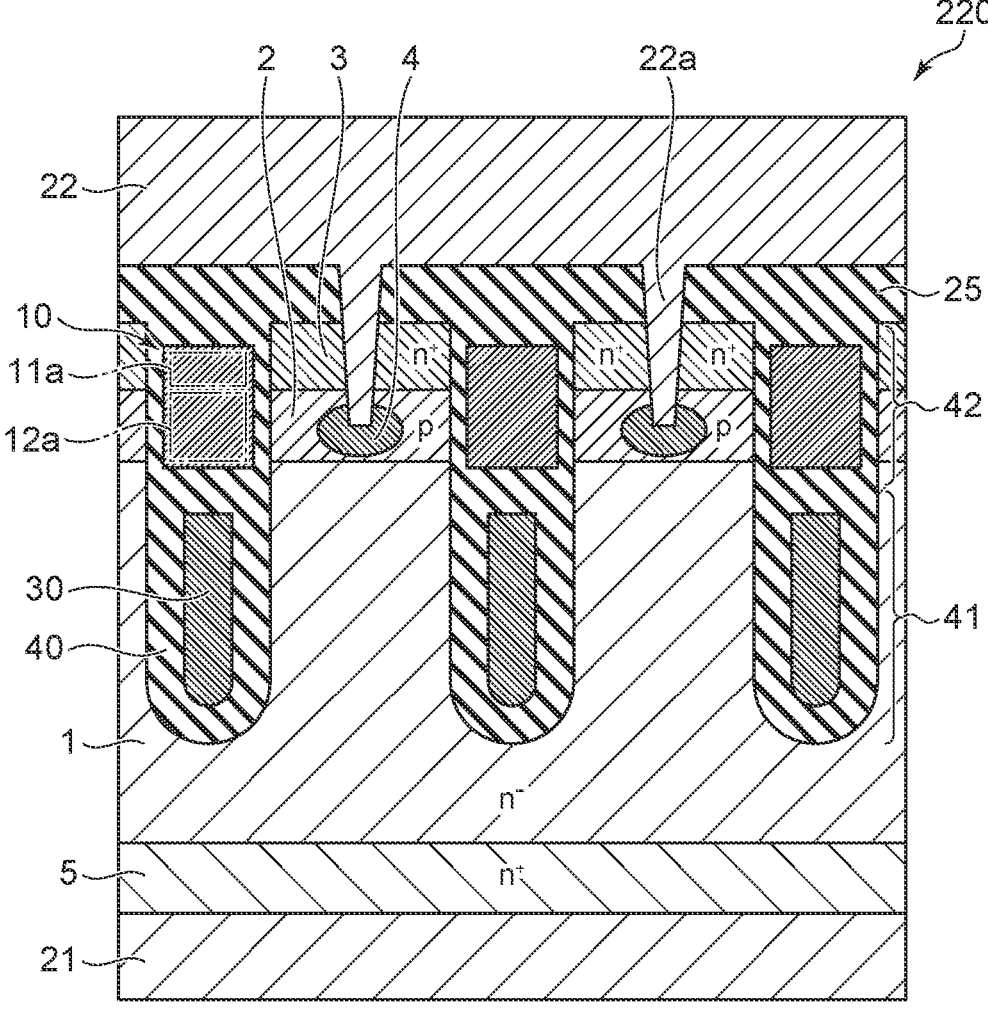
FIG. 20 is a cross-sectional view showing a semiconductor device according to a second modification of the second embodiment.
Figure 20:
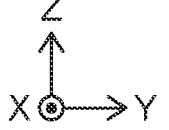
Figure 21:
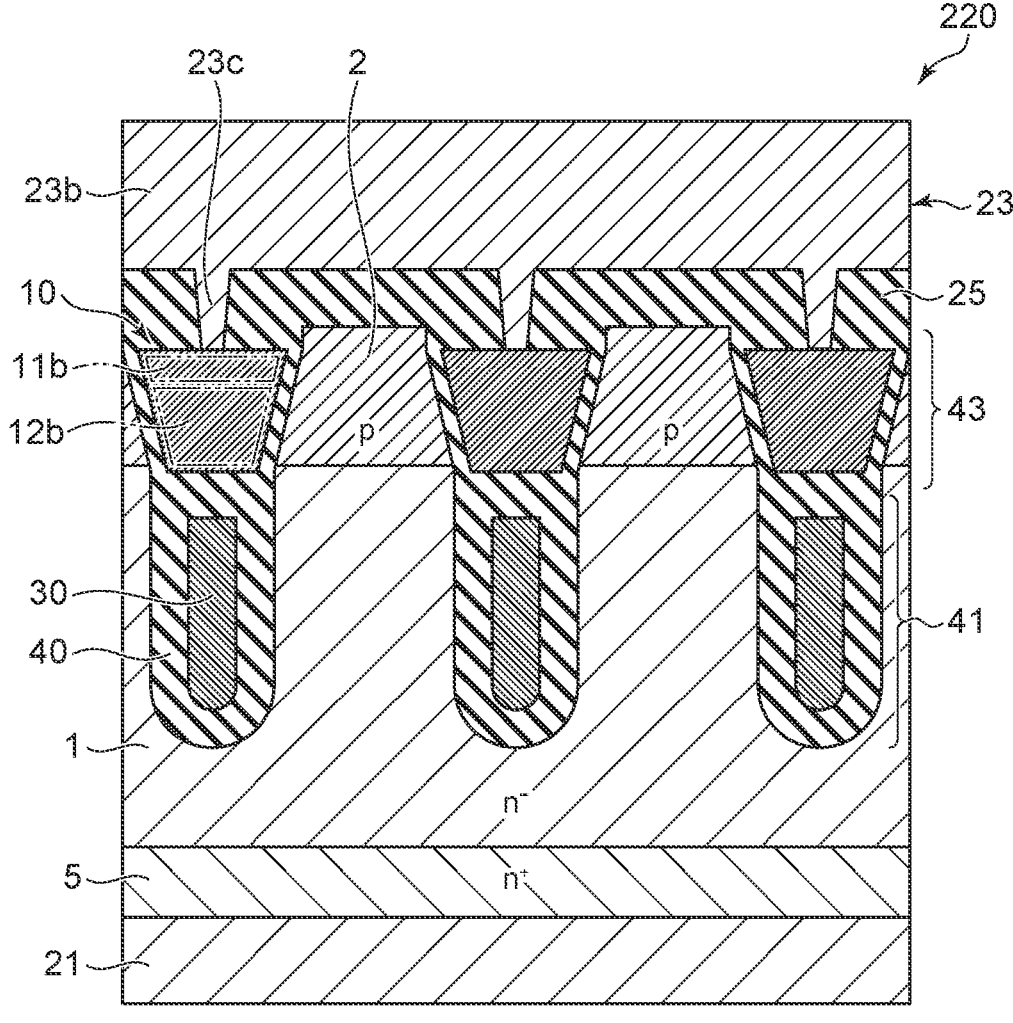
FIG. 21 is a cross-sectional view showing the semiconductor device according to the second modification of the second embodiment.
Figure 21:
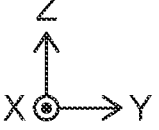

FIGS. 20 and 21 are cross-sectional views showing a semiconductor device according to a second modification of the second embodiment. FIGS. 20 and 21 correspond respectively to a XIII-XIII cross-sectional view and a XII-XIV cross-sectional view of FIG. 11.

In the semiconductor device 220 according to the second modification, the Y-Z cross-sectional shape of a portion of the gate electrode 10 is different from the Y-Z cross-sectional shape of the gate electrode 10 of the semiconductor device 210.

As shown in FIG. 21, the lower part 12 includes a portion 12a positioned under the first electrode portion 11a, and a portion 12b positioned under the second electrode portion 11b. In the gate electrode 10 of the semiconductor device 200 as shown in FIG. 19, the width increases in steps from the lower part 12 toward the second electrode portion 11b. In contrast, in the gate electrode 10 of the semiconductor device 220, the width gradually increases from the portion 12b toward the second electrode portion 11b.

The side surface of the second electrode portion 11b and the side surface of the portion 12b are oblique to the Z-direction. On the other hand, as shown in FIG. 20, the width is constant from the portion 12a toward the first electrode portion 11a. The inclines of the side surface of the first electrode portion 11a and the side surface of the portion 12a with respect to the Z-direction are less than the inclines of the side surface of the second electrode portion 11b and the side surface of the portion 12b with respect to the Z-direction.

According to the second modification, similarly to the first modification, the surface area of the p-n junction can be increased, and the breakdown voltage of the semiconductor device 220 can be increased.

Third Modification

Figure 22:
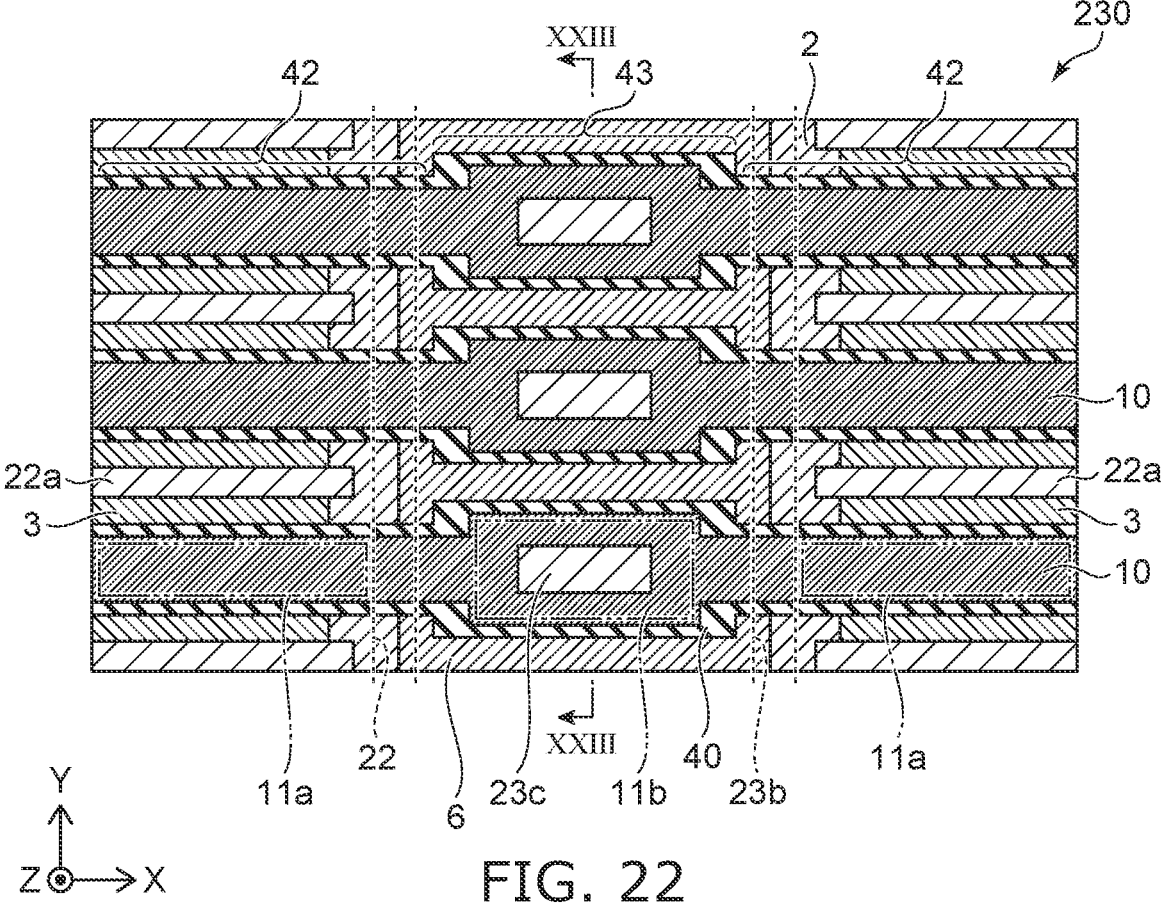
FIG. 22 is a plan view showing a semiconductor device according to a third modification of the second embodiment.
Figure 23:
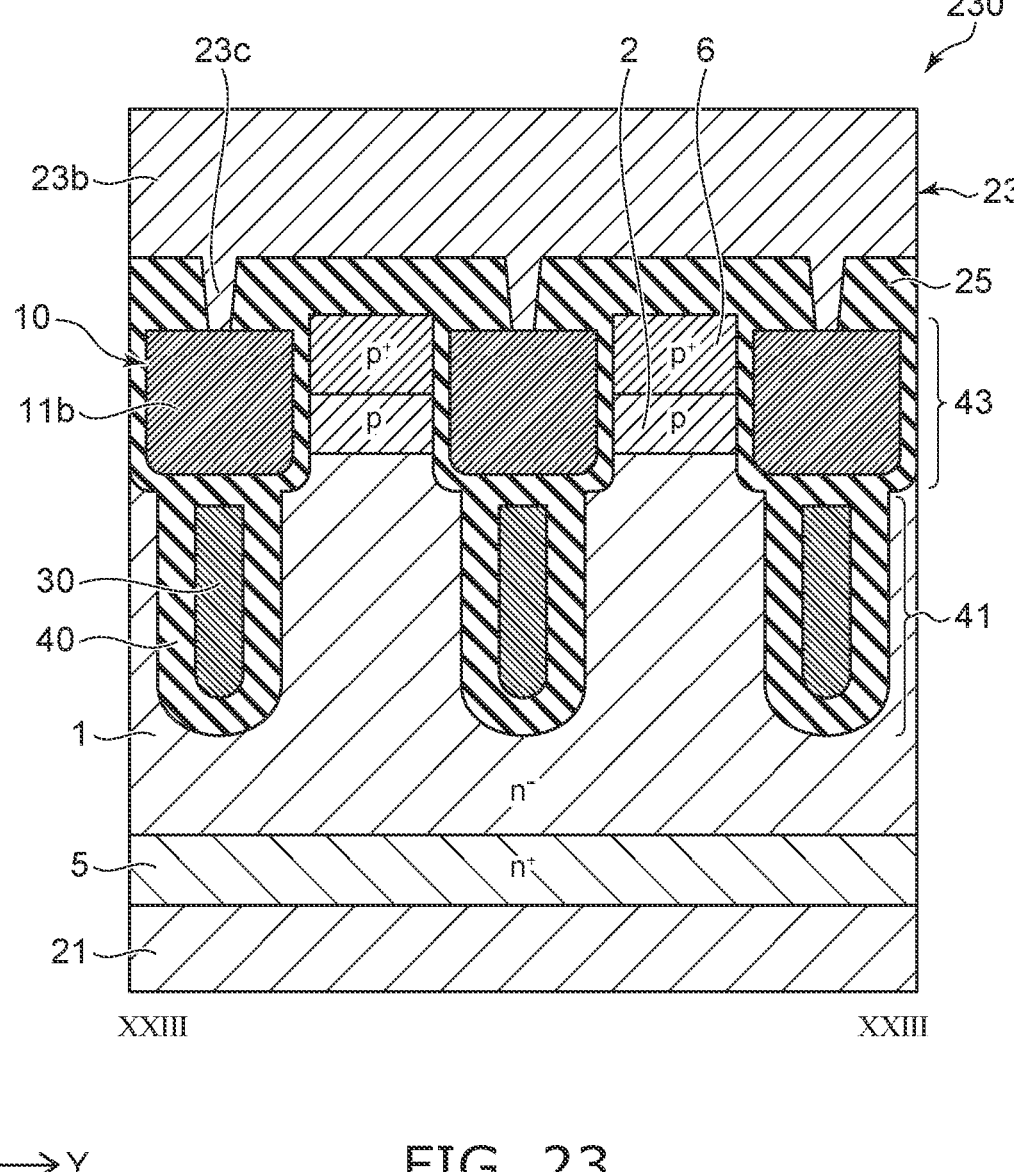
FIG. 23 is a XXIII-XXIII cross-sectional view of FIG. 22.

FIG. 22 is a plan view showing a semiconductor device according to a third modification of the second embodiment. FIG. 23 is a XXIII-XXIII cross-sectional view of FIG. 22.

As shown in FIGS. 22 and 23, compared to the semiconductor device 200, the semiconductor device 230 according to the third modification further includes a p$^+$-type contact region 6 (a fifth semiconductor region).

As shown in FIG. 22, the p$^+$-type contact region 6 is located around the third insulating portion 43 in the X-Y plane and contacts the third insulating portion 43. The p$^+$-type contact region 6 is positioned under the interconnect part 23b. As shown in FIG. 23, the p$^+$-type contact region 6 is positioned on the p-type base region 2. The p-type impurity concentration of the p$^+$-type contact region 6 is greater than the p-type impurity concentration of the p-type base region 2.

When the semiconductor device is switched to the off-state, the voltage that is applied to the semiconductor device may temporarily increase greatly, and avalanche breakdown may occur. At this time, a large number of carriers (electrons and holes) are generated. The electrons pass through the n$^+$-type drain region 5 and are discharged from the drain electrode 21. The holes pass through the p-type base region 2 and the p$^+$-type contact region 4 and are discharged from the source electrode 22.

The semiconductor device includes an n-p-n bipolar transistor (a parasitic transistor) made of the n$^-$-type drift region 1, the p-type base region 2, and the n$^+$-type source region 3. It is desirable for the electrical resistance of the holes to be smaller when the holes are discharged. If the potentials of the p-type base region 2 and the p$^+$-type contact region 4 rise due to the electrical resistance, there is a possibility that the parasitic transistor may operate. When the parasitic transistor operates, a large current flows in the semiconductor device, and breakdown of the semiconductor device occurs.

In the region below the source electrode 22, the holes are efficiently discharged by the p$^+$-type contact region 4 and the connection part 22a. In other words, the electrical resistance of the holes is sufficiently small. On the other hand, the p$^+$-type contact region 4 and the connection part 22a do not exist in the region below the interconnect part 23b. Therefore, the holes that are generated below the interconnect part 23b move through the p-type base region 2 to the regions at which the p$^+$-type contact region 4 and the connection part 22b are located. Therefore, holes easily accumulate in the region below the interconnect part 23b; and the potential of the p-type base region 2 easily rises.

For this problem, in the semiconductor device 230 according to the third modification, the p$^+$-type contact region 6 is located under the interconnect part 23b. The holes that flow in the p-type base region 2 can move with low resistance to the region below the source electrode 22 via the p$^+$-type contact region 6. The parasitic transistor does not easily operate when avalanche breakdown occurs because the rise of the potential of the p-type base region 2 can be suppressed. According to the third modification, the likelihood of breakdown of the semiconductor device 230 occurring can be reduced, and the reliability of the semiconductor device 230 can be further improved.

Fourth Modification

Figure 24:
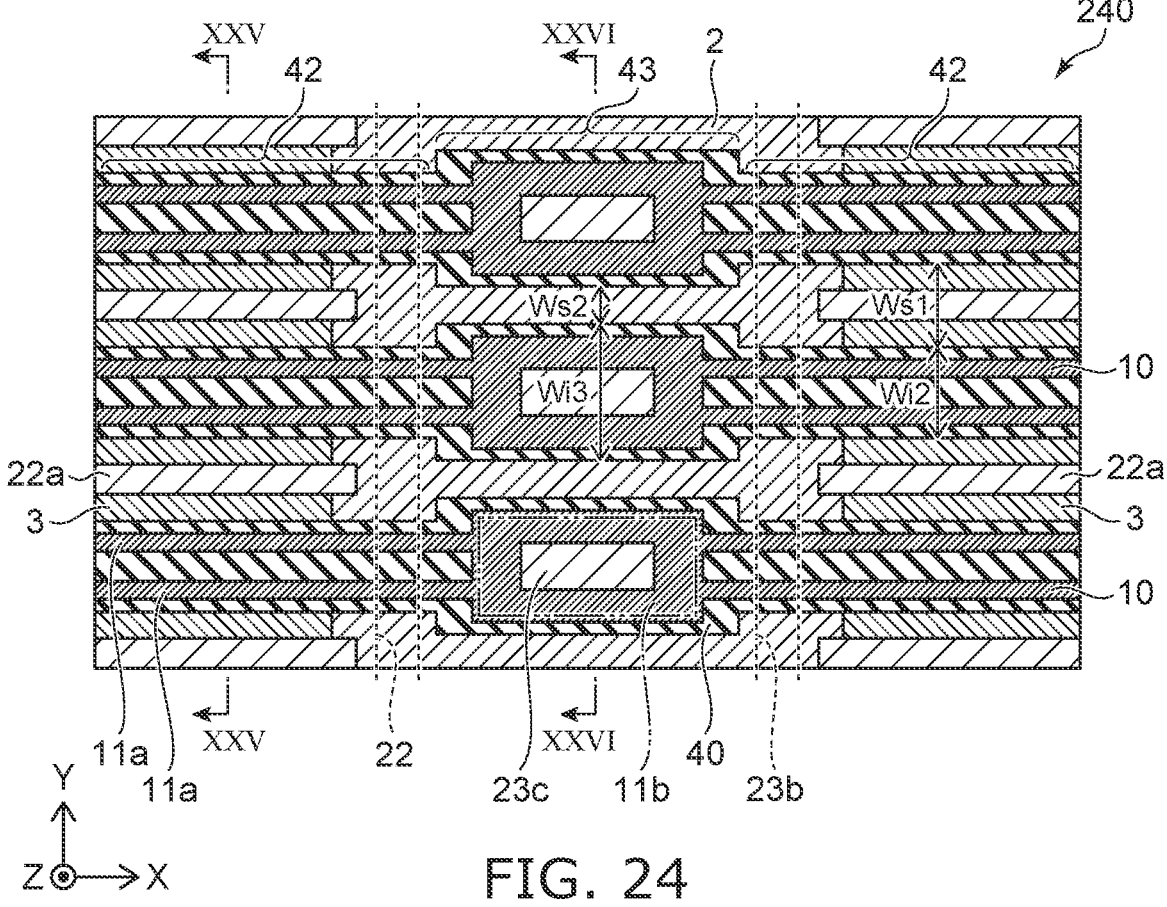
FIG. 24 is a plan view showing a semiconductor device according to a fourth modification of the second embodiment.
Figure 25:
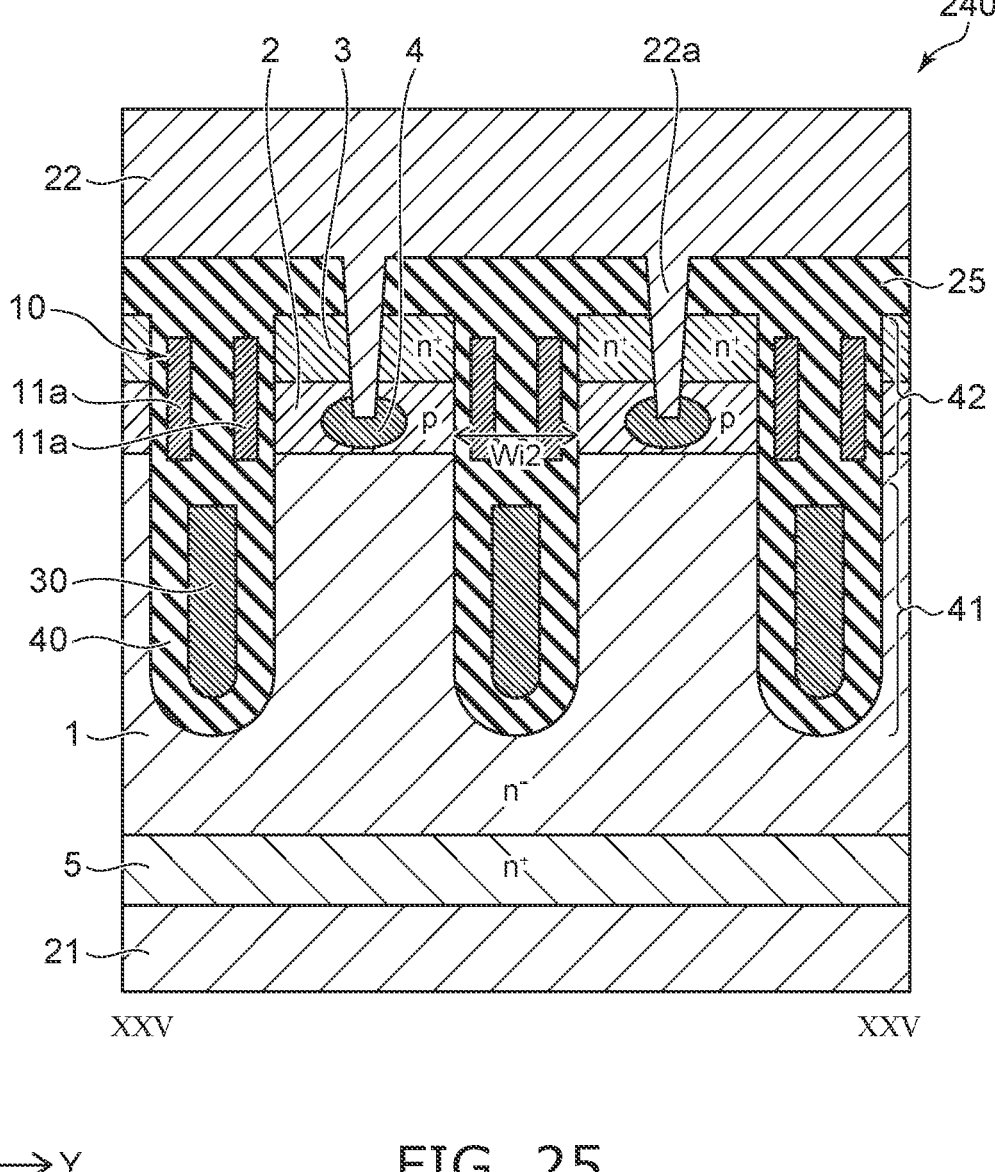
FIG. 25 is a XXV-XXV cross-sectional view of FIG. 24.
Figure 26:
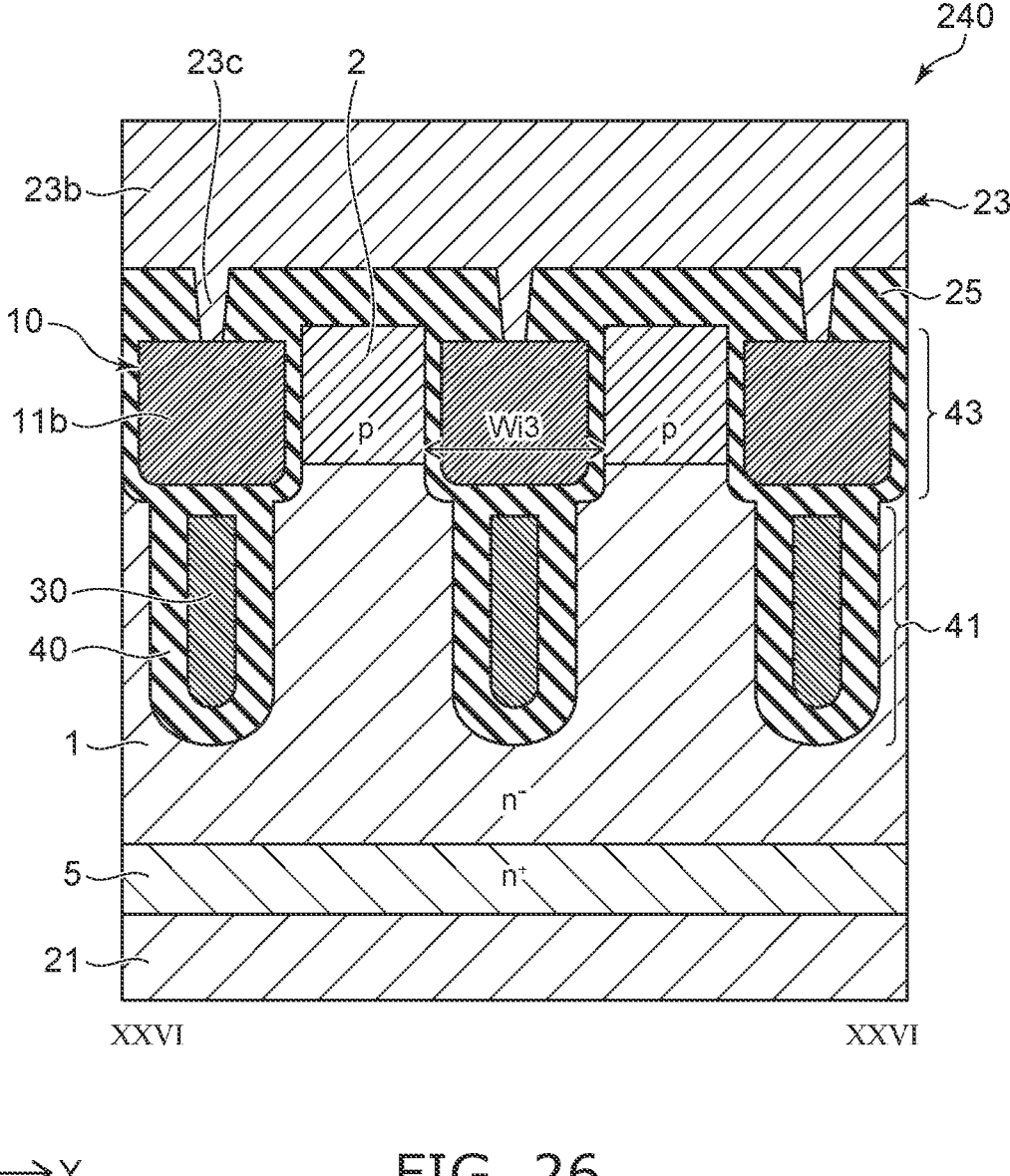
FIG. 26 is a XXVI-XXVI cross-sectional view of FIG. 24.

FIG. 24 is a plan view showing a semiconductor device according to a fourth modification of the second embodiment. FIGS. 25 and 26 are respectively a XXV-XXV cross-sectional view and a XXVI-XXVI cross-sectional view of FIG. 24.

In the semiconductor device 240 according to the fourth modification, the Y-Z cross-sectional shape of a portion of the gate electrode 10 is different from the Y-Z cross-sectional shape of a portion of the gate electrode 10 of the semiconductor device 200.

Specifically, as shown in FIGS. 24 and 25, a pair of first electrode portions 11a is located in the second insulating portion 42. The pair of first electrode portions 11a is separated from each other in the Y-direction. The first electrode portions 11a each extend along the X-direction. A portion of the conductive part 30 may extend further upward and may be positioned between the pair of first electrode portions 11a.

As shown in FIG. 26, the shape of the second electrode portion 11b of the gate electrode 10 in the semiconductor device 240 is the same as the shape of the second electrode portion 11b of the gate electrode 10 in the semiconductor device 200. The X-direction end portion of the first electrode portion 11a contacts the second electrode portion 11b.

As in the fourth modification, the subdivided first electrode portion 11a may be provided in the second insulating portion 42. In any case, the width Wi3 of the third insulating portion 43 is greater than the width Wi2 of the second insulating portion 42. Thereby, the gate pad 23 can be easily connected with the second electrode portion 11b located in the third insulating portion 43.

According to the fourth modification, the area of the gate electrode 10 and the conductive part 30 facing each other in the Z-direction can be reduced. As the facing area decreases, a gate-source capacitance Cgs between the gate electrode 10 and the conductive part 30 can be reduced. For example, the transition period when the semiconductor device 240 is turned on can be reduced, and the switching loss of the semiconductor device 240 can be reduced.

Third Embodiment

Figure 27:
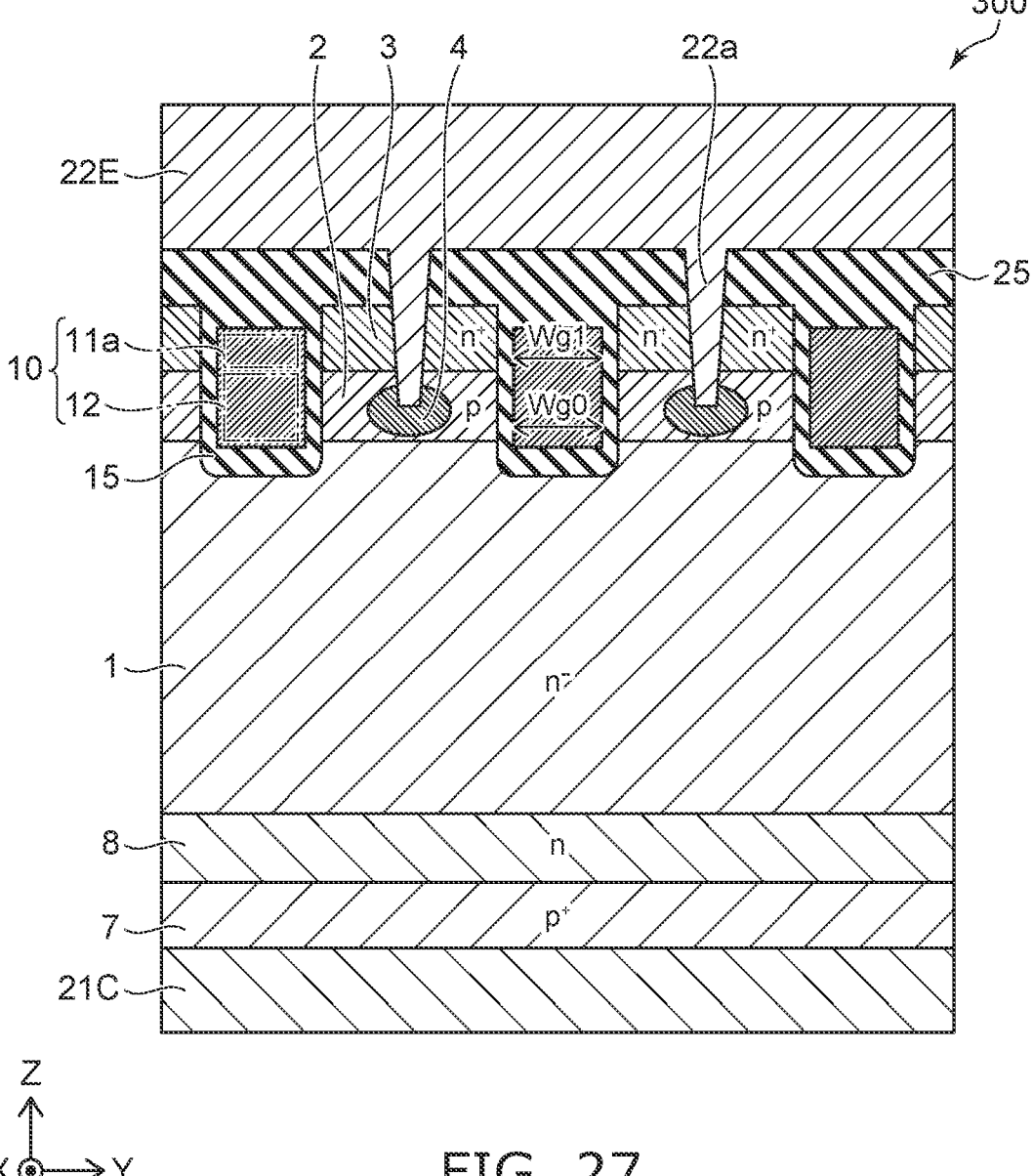
FIG. 27 is a cross-sectional view showing a semiconductor device according to a third embodiment.
Figure 28:
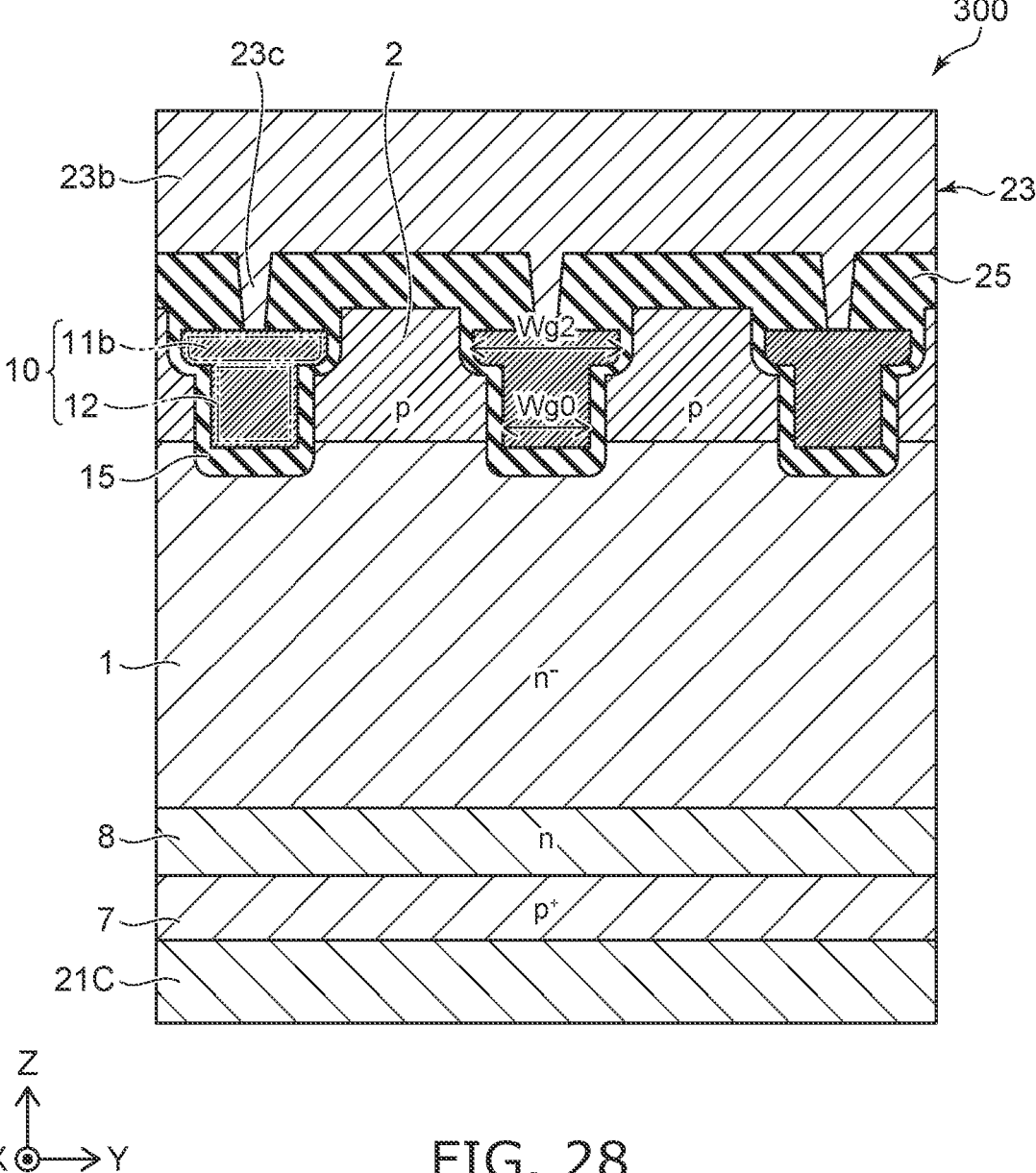
FIG. 28 is a cross-sectional view showing the semiconductor device according to the third embodiment.

FIGS. 27 and 28 are cross-sectional views showing a semiconductor device according to a third embodiment.

The semiconductor device 300 according to the third embodiment shown in FIGS. 27 and 28 is an IGBT. Compared to the semiconductor device 100, the semiconductor device 300 includes a p$^+$-type collector region 7 and an n-type buffer region 8 instead of the n$^+$-type drain region 5. Also, the semiconductor device 300 includes a collector electrode 21C and an emitter electrode 22E instead of the drain electrode 21 and the source electrode 22.

The collector electrode 21C and the emitter electrode 22E are respectively located at the lower surface and the upper surface of the semiconductor device 300. The p$^+$-type collector region 7 is located on the collector electrode 21C and electrically connected with the collector electrode 21C. The n-type buffer region 8 is located on the p$^+$-type collector region 7. The n$^-$-type drift region 1 is located on the n-type buffer region 8. The n-type impurity concentration of the n$^-$-type drift region 1 is less than the n-type impurity concentration of the n-type buffer region 8.

Similarly to the semiconductor device 100, the gate electrode 10 includes the upper part 11 and the lower part 12. The upper part 11 includes the first electrode portion 11a and the second electrode portion 11b. The width Wg2 of the second electrode portion 11b is greater than the width Wg1 of the first electrode portion 11a and greater than the width Wg0 of the lower part 12.

Operations of the semiconductor device 300 will now be described.

A voltage that is not less than a threshold is applied to the gate electrode 10 in a state in which a positive voltage with respect to the emitter electrode 22E is applied to the collector electrode 21C. Thereby, a channel (an inversion layer) is formed in the p-type base region 2. Electrons are injected from the emitter electrode 22E into the n⁻-type drift region 1 via the channel; and the semiconductor device 300 is set to the on-state. Holes are injected from the collector electrode 21C into the n⁻-type drift region 1 in response to injection of the electrons. Conductivity modulation occurs due to the injected electrons and holes; and the electrical resistance in the n⁻-type drift region 1 decreases. Subsequently, when a potential that is less than the threshold is applied to the gate electrode 10, the channel of the p-type base region 2 disappears, and the semiconductor device 300 is switched to the off-state.

In the semiconductor device 300 as well, similarly to the first embodiment, the gate electrode 10 includes the first electrode portion 11a and the second electrode portion 11b. Therefore, according to the third embodiment, the on-resistance of the semiconductor device 300 can be reduced or the breakdown voltage of the semiconductor device 300 can be increased while suppressing the degradation of the reliability of the semiconductor device 300.

The forms described above can be combined as appropriate. For example, the Y-Z cross-sectional shape of the gate electrode 10 of the semiconductor device 220 is applicable to the gate electrode 10 of the semiconductor device 100. In the semiconductor device 100, the p⁺-type contact region 6 may be provided under the interconnect part 23b. In the semiconductor device 100, multiple gate electrodes 10 may be provided in one gate insulating layer 15 as in the semiconductor device 240.

The embodiments may include the following configurations.

(Configuration 1)

A semiconductor device, comprising:

a first electrode;

a first semiconductor region located on the first electrode and electrically connected with the first electrode, the first semiconductor region being of a first conductivity type;

a second semiconductor region located on the first semiconductor region, the second semiconductor region being of a second conductivity type;

a third semiconductor region located on the second semiconductor region, the third semiconductor region being of the first conductivity type;

a gate electrode facing the second semiconductor region via a gate insulating layer in a second direction, the second direction being perpendicular to a first direction, the first direction being from the first electrode toward the first semiconductor region, an upper part of the gate electrode including a first electrode portion and a second electrode portion, the first electrode portion facing the third semiconductor region via the gate insulating layer in the second direction, the second electrode portion being arranged with the first electrode portion in a third direction perpendicular to the first and second directions, a length in the second direction of the second electrode portion being greater than a length in the second direction of the first electrode portion and greater than a length in the second direction of a lower part of the gate electrode;

a second electrode located on the second and third semiconductor regions and electrically connected with the second and third semiconductor regions; and a third electrode separated from the second electrode, the third electrode including an interconnect part located on the second electrode portion and electrically connected with the second electrode portion.

(Configuration 2)

The semiconductor device according to Configuration 1, wherein the second electrode includes a connection part, the connection part contacts the third semiconductor region and a portion of the second semiconductor region, and the third semiconductor region is positioned between the first electrode portion and the connection part in the second direction.

(Configuration 3)

The semiconductor device according to Configuration 1 or 2, further comprising:

a conductive part located in the first semiconductor region with an insulating part interposed, the second electrode being electrically connected with the conductive part.

(Configuration 4)

The semiconductor device according to Configuration 3, wherein the conductive part includes:

a first conductive portion facing the first semiconductor region via the insulating part in the second direction; and a second conductive portion located on the first conductive portion and arranged with the gate electrode in a third direction perpendicular to the first and second directions, a length in the second direction of the second conductive portion is greater than a length in the second direction of the first conductive portion, and the second electrode contacts the second conductive portion.

(Configuration 5)

The semiconductor device according to any one of Configurations 1 to 4, wherein a plurality of the gate electrodes is arranged in the second direction, and the interconnect part is positioned on a plurality of the second electrode portions and contacts the plurality of second electrode portions.

(Configuration 6)

A semiconductor device, comprising:

the first electrode;

a first semiconductor region located on the first electrode and electrically connected with the first electrode, the first semiconductor region being of a first conductivity type;

a second semiconductor region located on the first semiconductor region, the second semiconductor region being of a second conductivity type;

a third semiconductor region located on the second semiconductor region, the third semiconductor region being of the first conductivity type;

an insulating part including a first insulating portion arranged with the first semiconductor region in a second direction perpendicular to a first direction, the first direction being from the first electrode toward the first semiconductor region,

a second insulating portion located on the first insulating portion and arranged with the second and third semiconductor regions in the second direction, and a third insulating portion arranged with the second insulating portion in a third direction perpendicular to the first and second directions, a length in the second direction of the third insulating portion being greater than a length in the second direction of the first insulating portion and greater than a length in the second direction of the second insulating portion;

a conductive part located in the first insulating portion;

a gate electrode, at least a portion of the gate electrode being located in the second and third insulating portions;

a second electrode located on the second and third semiconductor regions and electrically connected with the second and third semiconductor regions; and a third electrode separated from the second electrode and electrically connected with the gate electrode, the third electrode including an interconnect part located on the third insulating portion.

(Configuration 7)

The semiconductor device according to Configuration 6, wherein a lower part of the gate electrode is located in the first insulating portion, and an upper part of the gate electrode is located in the second and third insulating portions.

(Configuration 8)

The semiconductor device according to Configuration 7, wherein the upper part of the gate electrode includes:

a first electrode portion located in the second insulating portion, and a second electrode portion located in the third insulating portion, and a length in the second direction of the second electrode portion is greater than a length in the second direction of the first electrode portion and greater than a length in the second direction of the lower part of the gate electrode.

(Configuration 9)

The semiconductor device according to any one of Configurations 6 to 8, further comprising:

a fifth semiconductor region located around the third insulating portion and positioned on the second semiconductor region, the fifth semiconductor region being of the second conductivity type, a second-conductivity-type impurity concentration of the fifth semiconductor region being greater than a second-conductivity-type impurity concentration of the second semiconductor region.

(Configuration 10)

The semiconductor device according to any one of Configurations 6 to 9, wherein a portion of the first insulating portion is positioned under the second insulating portion, an other portion of the first insulating portion is positioned under the third insulating portion, and a length in the second direction of the other portion of the first insulating portion is greater than 0.9 times and less than 1.1 times a length in the second direction of the portion of the first insulating portion.

(Configuration 11)

A semiconductor device, comprising:

a first electrode;

18 a first semiconductor region located on the first electrode and electrically connected with the first electrode, the first semiconductor region being of a first conductivity type;

a second semiconductor region located on the first semiconductor region, the second semiconductor region being of a second conductivity type;

a third semiconductor region located on the second semiconductor region, the third semiconductor region being of the first conductivity type;

a pair of insulating parts arranged with the first, second, and third semiconductor regions in a second direction perpendicular to a first direction, the first direction being from the first electrode toward the first semiconductor region, the pair of insulating parts being separated from each other in the second direction;

a pair of conductive parts located respectively in the pair of insulating parts, each of the pair of conductive parts facing the first semiconductor region in the second direction;

a pair of gate electrodes located respectively in the pair of insulating parts, each of the pair of gate electrodes including a first electrode portion and a second electrode portion, the first electrode portion facing the third semiconductor region in the second direction, the second electrode portion being arranged with the first electrode portion in a third direction perpendicular to the first and second directions, the second electrode portion facing the second semiconductor region in the second direction, the second electrode portion having a longer length in the second direction than the first electrode portion, a length in the second direction of the second semiconductor region between a pair of the second electrode portions being greater than a length in the second direction of the second semiconductor region between a pair of the first electrode portions and greater than a length in the second direction of the first semiconductor region between the pair of conductive parts;

a second electrode located on the second and third semiconductor regions and electrically connected with the second and third semiconductor regions; and a third electrode separated from the second electrode and electrically connected with the pair of second electrode portions, the third electrode including an interconnect part located on the pair of second electrode portions.

The relative levels of the impurity concentrations between respective semiconductor regions according to the embodiments described above can be confirmed by, for example, SCM (Scanning Capacitance Microscopy). Carrier concentrations in the respective semiconductor regions can be considered to be equal to the impurity concentrations activated in the respective semiconductor regions. Therefore, the relative levels of the impurity concentrations between respective semiconductor regions can be confirmed by SCM as well. The impurity concentrations in the respective semiconductor regions can be measured by, for example, SIMS (Secondary Ion Mass Spectrometry).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:

a first electrode;

a first semiconductor region located on the first electrode and electrically connected with the first electrode, the first semiconductor region being of a first conductivity type;

a second semiconductor region located on the first semiconductor region, the second semiconductor region being of a second conductivity type;

a third semiconductor region located on the second semiconductor region, the third semiconductor region being of the first conductivity type;

a gate electrode aligned with the second semiconductor region in a second direction with a gate insulating layer interposed, the second direction being perpendicular to a first direction, the first direction being from the first electrode toward the first semiconductor region, an upper part of the gate electrode including two first electrode portions and a second electrode portion, the second electrode portion being positioned between the two first electrode portions in a third direction perpendicular to the first and second directions, one of the two first electrode portions being aligned with the third semiconductor region in the second direction with the gate insulating layer interposed, a length in the second direction of the second electrode portion being greater than a length in the second direction of each of the two first electrode portions and greater than a length in the second direction of a lower part of the gate electrode;

a second electrode located on the second and third semiconductor regions and electrically connected with the second and third semiconductor regions; and a third electrode separated from the second electrode, the third electrode including an interconnect part located on the second electrode portion and electrically connected with the second electrode portion.

2. The device according to claim 1, wherein the second electrode includes a connection part, the connection part contacts the third semiconductor region and a portion of the second semiconductor region, and the third semiconductor region is positioned between one of the two first electrode portions and the connection part in the second direction.

3. The device according to claim 1, further comprising:

a conductive part located in the first semiconductor region with an insulating part interposed, the second electrode being electrically connected with the conductive part.

4. The device according to claim 3, wherein the conductive part includes:

a first conductive portion facing the first semiconductor region via the insulating part in the second direction; and a second conductive portion located on the first conductive portion and arranged with the gate electrode in a third direction perpendicular to the first and second directions, a length in the second direction of the second conductive portion is greater than a length in the second direction of the first conductive portion, and the second electrode contacts the second conductive portion.

5. The device according to claim 1, wherein the gate electrode is one of a plurality of gate electrodes arranged in the second direction, each gate electrode of the plurality comprises a second electrode portion, and the interconnect part is positioned on a plurality of the second electrode portions formed by the plurality of gate electrodes.

6. The device according to claim 1, wherein the third semiconductor region is one of two third semiconductor regions provided on the second semiconductor region, and the two first electrode portions are respectively aligned with the two third semiconductor regions with the gate insulating layer interposed.

7. The device according to claim 5, wherein a distance in the second direction between adjacent second electrode portions is less than a distance in the second direction between adjacent first electrode portions.

8. The device according to claim 7, wherein the distance in the second direction between the adjacent second electrode portions is less than a distance in the second direction between adjacent lower parts of adjacent gate electrodes.

9. The device according to claim 1, wherein the second electrode portion is one of two second electrode portions, and the two first electrode portions and the two second electrode portions are alternately arranged in the third direction.

10. The device according to claim 9, wherein the interconnect part is one of two interconnect parts arranged in the third direction, and the two interconnect parts are respectively positioned on the two second electrode portions.

11. The device according to claim 1, wherein the length in the second direction of the second electrode portion is not less than 1.1 times the length in the second direction of one of the two first electrode portions or the length in the second direction of the lower part of the gate electrode.

12. The device according to claim 1, wherein a difference between the length in the second direction of the second electrode portion and the length in the second direction of one of the two first electrode portions is greater than a difference between the length in the second direction of the second electrode portion and the length in the second direction of the lower part of the gate electrode.

* * * * *